(12) United States Patent
Breil et al.

(10) Patent No.: US 9,318,336 B2
(45) Date of Patent: Apr. 19, 2016

(54) NON-VOLATILE MEMORY STRUCTURE EMPLOYING HIGH-K GATE DIELECTRIC AND METAL GATE

(75) Inventors: Nicolas Breil, Grenoble (FR); Michael P. Chudzik, Danbury, CT (US); Rishikesh Krishnan, Poughkeepsie, NY (US); Siddarth A. Krishnan, Peekskill, NY (US); Unoh Kwon, Fishkill, NY (US)

(73) Assignee: GLOBALFOUNDRIES U.S. 2 LLC, Hopewell Junction, NY (US)

( * ) Notice: Subject to any disclaimer, the term of this patent is extended or adjusted under 35 U.S.C. 154(b) by 243 days.

(21) Appl. No.: 13/326,767

(22) Filed: Dec. 15, 2011

(65) Prior Publication Data
US 2013/0105879 A1     May 2, 2013

(30) Foreign Application Priority Data

Oct. 27, 2011    (FR) .................................. 11306392.9

(51) Int. Cl.
| | |
|---|---|
| H01L 27/115 | (2006.01) |
| H01L 21/28 | (2006.01) |
| H01L 29/51 | (2006.01) |
| H01L 29/788 | (2006.01) |
| H01L 21/8238 | (2006.01) |
| H01L 29/423 | (2006.01) |
| H01L 29/66 | (2006.01) |

(Continued)

(52) U.S. Cl.
CPC ...... *H01L 21/28273* (2013.01); *H01L 21/0228* (2013.01); *H01L 21/823842* (2013.01); *H01L 21/823857* (2013.01); *H01L 21/823892* (2013.01); *H01L 27/11546* (2013.01); *H01L 29/42376* (2013.01); *H01L 29/513* (2013.01); *H01L 29/66545* (2013.01); *H01L 29/7881* (2013.01); *H01L 29/4958* (2013.01); *H01L 29/4966* (2013.01); *H01L 29/517* (2013.01)

(58) Field of Classification Search
CPC ................... H01L 27/11517; H01L 27/11531; H01L 27/11546
See application file for complete search history.

(56) References Cited

U.S. PATENT DOCUMENTS

| | | | |
|---|---|---|---|
| 6,048,766 A | 4/2000 | Gardner et al. | |
| 6,674,138 B1 | 1/2004 | Halliyal et al. | |
| 6,853,587 B2 | 2/2005 | Forbes | |

(Continued)

OTHER PUBLICATIONS

Office Action dated Mar. 19, 2015 received in U.S. Appl. No. 14/066,119.

*Primary Examiner* — Jae Lee
(74) *Attorney, Agent, or Firm* — Scully, Scott, Murphy & Presser, P.C.

(57) ABSTRACT

A high dielectric constant (high-k) gate dielectric for a field effect transistor (FET) and a high-k tunnel dielectric for a non-volatile random access memory (NVRAM) device are simultaneously formed on a semiconductor substrate. A stack of at least one conductive material layer, a control gate dielectric layer, and a disposable material layer is subsequently deposited and lithographically patterned. A planarization dielectric layer is deposited and patterned, and disposable material portions are removed. A remaining portion of the control gate dielectric layer is preserved in the NVRAM device region, but is removed in the FET region. A conductive material is deposited in gate cavities to provide a control gate for the NVRAM device and a gate portion for the FET. Alternately, the control gate dielectric layer may replaced with a high-k control gate dielectric in the NVRAM device region.

19 Claims, 18 Drawing Sheets

(51) Int. Cl.
*H01L 21/02* (2006.01)
*H01L 29/49* (2006.01)

(56) References Cited

U.S. PATENT DOCUMENTS

| | | | |
|---|---|---|---|
| 7,106,625 B2 | 9/2006 | Yeh | |
| 7,135,370 B2 | 11/2006 | Baker | |
| 7,221,018 B2 | 5/2007 | Forbes | |
| 7,265,414 B2 | 9/2007 | Forbes | |
| 7,391,075 B2 | 6/2008 | Jeon et al. | |
| 7,480,186 B2 | 1/2009 | Forbes | |
| 7,485,530 B2 | 2/2009 | Yeh | |
| 7,498,247 B2 | 3/2009 | Ahn et al. | |
| 7,508,025 B2 | 3/2009 | Eldridge et al. | |
| 7,528,037 B2 | 5/2009 | Forbes | |
| 7,577,027 B2 | 8/2009 | Prall | |
| 7,586,144 B2 | 9/2009 | Forbes | |
| 7,605,030 B2 | 10/2009 | Forbes et al. | |
| 7,616,482 B2 | 11/2009 | Prall | |
| 7,737,488 B2 | 6/2010 | Lai et al. | |
| 7,750,395 B2 | 7/2010 | Bhattacharyya | |
| 7,763,934 B2 | 7/2010 | Shimizu et al. | |
| 7,829,938 B2 | 11/2010 | Bhattacharyya | |
| 7,902,582 B2 | 3/2011 | Forbes et al. | |
| 7,910,446 B2 | 3/2011 | Ma et al. | |
| 7,915,126 B2 | 3/2011 | Weimer | |
| 7,915,174 B2 | 3/2011 | Ahn et al. | |
| 2005/0167734 A1 | 8/2005 | She et al. | |
| 2006/0166420 A1* | 7/2006 | Van Duuren et al. | 438/197 |
| 2007/0034936 A1 | 2/2007 | Van Schaijk et al. | |
| 2007/0132003 A1 | 6/2007 | Takashima et al. | |
| 2007/0243682 A1 | 10/2007 | Forbes et al. | |
| 2008/0265306 A1* | 10/2008 | Van Schaijk et al. | 257/324 |
| 2009/0146201 A1 | 6/2009 | Zheng et al. | |
| 2010/0013009 A1* | 1/2010 | Pan | 257/330 |
| 2010/0072536 A1 | 3/2010 | Ho et al. | |
| 2010/0167490 A1* | 7/2010 | Choi et al. | 438/400 |
| 2011/0171818 A1* | 7/2011 | Cha et al. | 438/586 |
| 2012/0043623 A1* | 2/2012 | Doris et al. | 257/410 |
| 2012/0051132 A1* | 3/2012 | Sandhu et al. | 365/185.05 |

* cited by examiner

NON-VOLATILE MEMORY STRUCTURE EMPLOYING HIGH-K GATE DIELECTRIC AND METAL GATE

BACKGROUND

The present disclosure generally relates to semiconductor devices, and particularly to field effect transistors including a non-volatile memory device employing a high dielectric constant (high-k) control gate dielectric, and methods of manufacturing the same.

The tunnel oxide in non-volatile random access memory (NVRAM) devices does not scale with traditional silicon oxynitrides due to the need for reduction of effective oxide thickness (EOT). At the same time, the capacitance of the control gate dielectric needs to maintain a certain level of capacitance. A method is desired for simultaneously enabling device scaling on NVRAM devices and on other types of devices employing a single gate dielectric.

BRIEF SUMMARY

A high dielectric constant (high-k) gate dielectric for a field effect transistor (FET) and a high-k tunnel dielectric for a non-volatile random access memory (NVRAM) device are simultaneously formed on a semiconductor substrate. A stack of at least one conductive material layer, a control gate dielectric layer, and a disposable material layer is subsequently deposited and lithographically patterned. A planarization dielectric layer is deposited and patterned, and disposable material portions are removed to form gate cavities in a FET region and an NVRAM device region. A remaining portion of the control gate dielectric layer is preserved in the NVRAM device region, but is removed in the FET region. A conductive material is deposited in the gate cavities to provide a control gate for the NVRAM device and a gate portion for the FET. Alternately, the control gate dielectric layer may be removed in the FET region and replaced with a high-k control gate dielectric in the NVRAM device region.

According to an aspect of the present disclosure, a method of forming a semiconductor structure including a field effect transistor is provided. The field effect transistor includes: a tunnel dielectric including a first dielectric material having a dielectric constant greater than 8.0 and located on a semiconductor substrate; a floating gate electrode structure including at least a metallic material portion contacting the tunnel dielectric; a control gate dielectric located on the floating gate electrode structure and including a second dielectric material; and a control gate electrode structure located on the control gate dielectric.

According to another aspect of the present disclosure, a method of forming a semiconductor structure including a field effect transistor is provided. The field effect transistor is formed by: forming a tunnel dielectric including a first dielectric material having a dielectric constant greater than 8.0 on a semiconductor substrate; forming a floating gate electrode structure including at least a metallic material portion contacting the tunnel dielectric; forming a control gate dielectric including a second dielectric material directly on the floating gate electrode structure; and forming a control gate electrode structure directly on the control gate dielectric.

DETAILED DESCRIPTION

Figure 1:
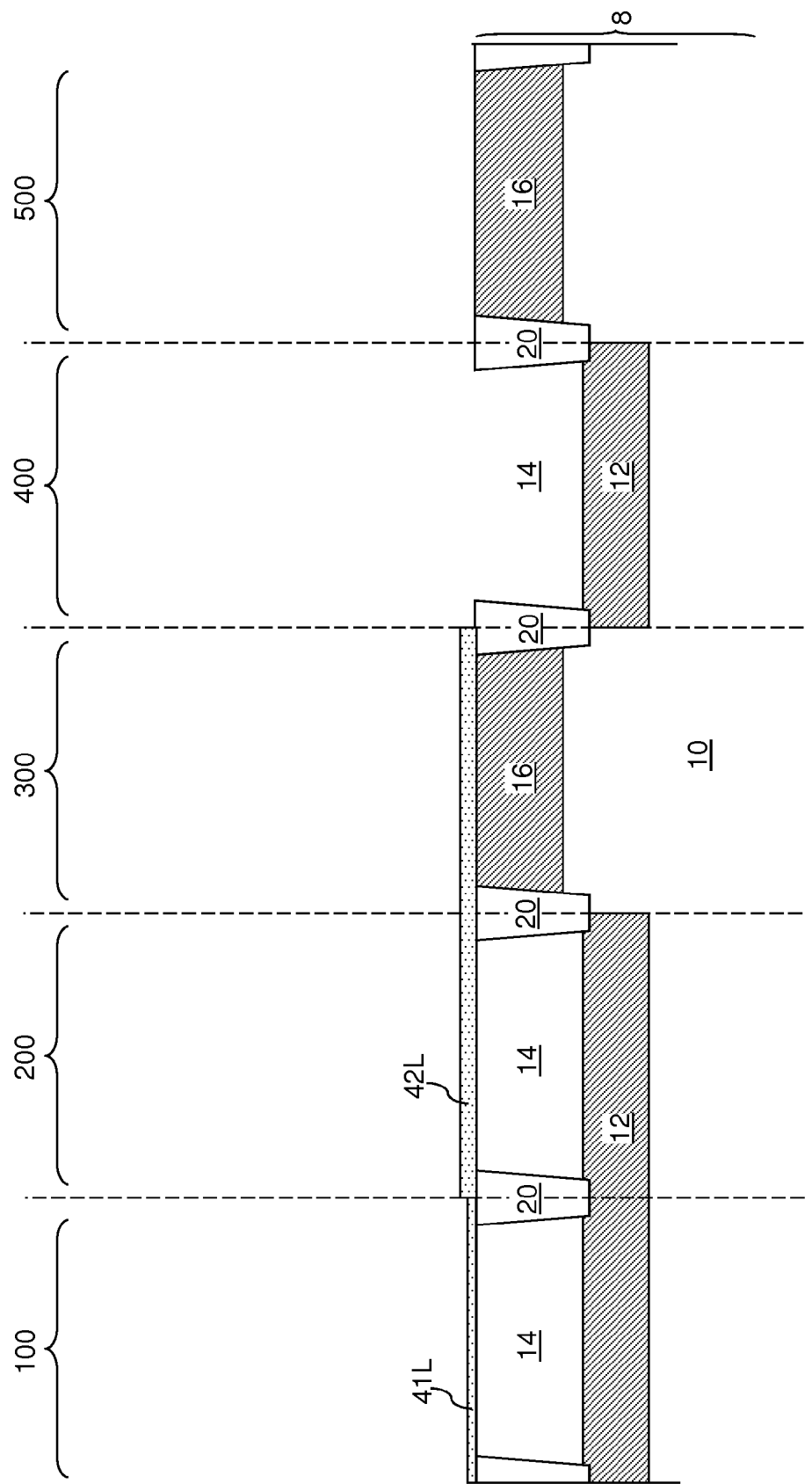
FIG. 1 is a vertical cross-sectional view of a first exemplary semiconductor structure after formation of silicon oxide layers according to a first embodiment of the present disclosure.

As stated above, the present disclosure relates to field effect transistors including a non-volatile memory device employing a high dielectric constant (high-k) control gate dielectric and methods of manufacturing the same, which are now described in detail with accompanying figures. It is noted that like and corresponding elements mentioned herein and illustrated in the drawings are referred to by like reference numerals. Figures are not drawn to scale. Further, it is noted that ordinal references of elements in the present disclosure are employed for labeling similar elements. As such, ordinals in the claims may, or may not, match the corresponding ordinals in the specification.

Referring to FIG. 1, a first exemplary semiconductor structure according to a first embodiment of the present disclosure includes a semiconductor substrate 8. The semiconductor substrate 8 includes at least a semiconductor material layer 10. The semiconductor material layer 10 includes a single crystalline semiconductor material having a doping of a first conductivity type, which can be p-type or n-type. The semiconductor substrate 10 can be a bulk substrate or a semiconductor-on-insulator (SOI) substrate.

At least one buried portion of the semiconductor material layer 10 can be converted into at least one buried well 12 having a doping of a second conductivity type, which is the opposite of the first conductivity type. For example, if the first conductivity type is p-type, the second conductivity type is n-type, and vice versa. Triple well structures can be formed by forming first conductivity type wells 14 above the at least one buried well. The first conductivity type wells 14 have a doping of the first conductivity type. Further, dual well structures can be formed by forming second conductivity type wells 16 in the upper portions of the semiconductor substrate 8 and directly on the semiconductor material layer 10. The second conductivity type wells 16 have a doping of the second conductivity type.

While FIG. 1 illustrates a semiconductor substrate 8 that is a bulk substrate, embodiments are also contemplated in which the semiconductor substrate 8 is a semiconductor-on-insulator (SOI) substrate and the semiconductor material layer 10 is formed as a top semiconductor layer located on a stack, from top to bottom, of a buried insulator layer (not shown) and a handle substrate (not shown).

Various semiconductor devices can be subsequently formed on the semiconductor substrate 8. For illustrative purposes, five device regions are illustrated in FIG. 1. Embodiments in which some device regions are omitted and/or some other device regions are duplicated in multiple instances can also be employed. The five device regions are labeled as a first device region 100, a second device region 200, a third device region 300, a fourth device region 400, and a fifth device region 500. In an illustrative example, a non-volatile flash memory device is formed in the first device region 100, a high voltage field effect transistor of the second conductivity type is formed in the second device region 200, a high voltage field effect transistor of the first conductivity type is formed in the third device region 300, a high performance field effect transistor of the second conductivity type is formed in the fourth device region 400, and a high performance field effect transistor of the first conductivity type is formed in the fifth device region 500.

Each of the various device regions (100, 200, 300, 400, 500) can be laterally electrically isolated by shallow trench isolation structures 20, which can be formed employing methods known in the art.

An oxide layer 42L can be formed on the semiconductor surfaces in the second and third device regions (200, 300). The oxide layer 42L includes a dielectric oxide having a dielectric constant less than 8.0. In one embodiment, the oxide layer 42L can be a silicon oxide layer. The oxide layer 42L is subsequently employed as a component of gate dielectrics for the high voltage field effect transistors to be formed in the second and third device regions (200, 300). The oxide layer 42L can be deposited as a high temperature oxide in a low pressure chemical vapor deposition (LPCVD) process or a rapid thermal chemical vapor deposition (RTCVD). The oxide layer 42L can be deposited as a conformal layer on the entirety of the top surface of the semiconductor substrate 8, and lithographically patterned to remove portions located in the first, fourth, and fifth device regions (100, 400, 500). The thickness of the oxide layer 42L can be from 1 nm to 10 nm, although lesser and greater thicknesses can also be employed.

Optionally, a second oxide layer 41L having a thickness less than the thickness of the oxide layer 42L can be formed in the first device region 100. As an optional layer, the second oxide layer 41L may, or may not, be formed. The second oxide layer 41L includes a dielectric oxide having a dielectric constant less than 8.0. In one embodiment, the second oxide layer 41L can be a silicon oxide layer. The second oxide layer 41L can be deposited as a high temperature oxide in a low pressure chemical vapor deposition (LPCVD) process or a rapid thermal chemical vapor deposition (RTCVD). The second oxide layer 41L can be deposited as a conformal layer on the entirety of the top surface of the semiconductor substrate 8, and lithographically patterned to remove portions located in the fourth and fifth device regions (400, 500). The portions of the second oxide layer 41L in the second and third device regions (200, 300) may be added to the oxide layer 42L. The thickness of the second oxide layer 41L can be from 0.5 nm to 2 nm, although lesser and greater thicknesses can also be employed.

Figure 2:
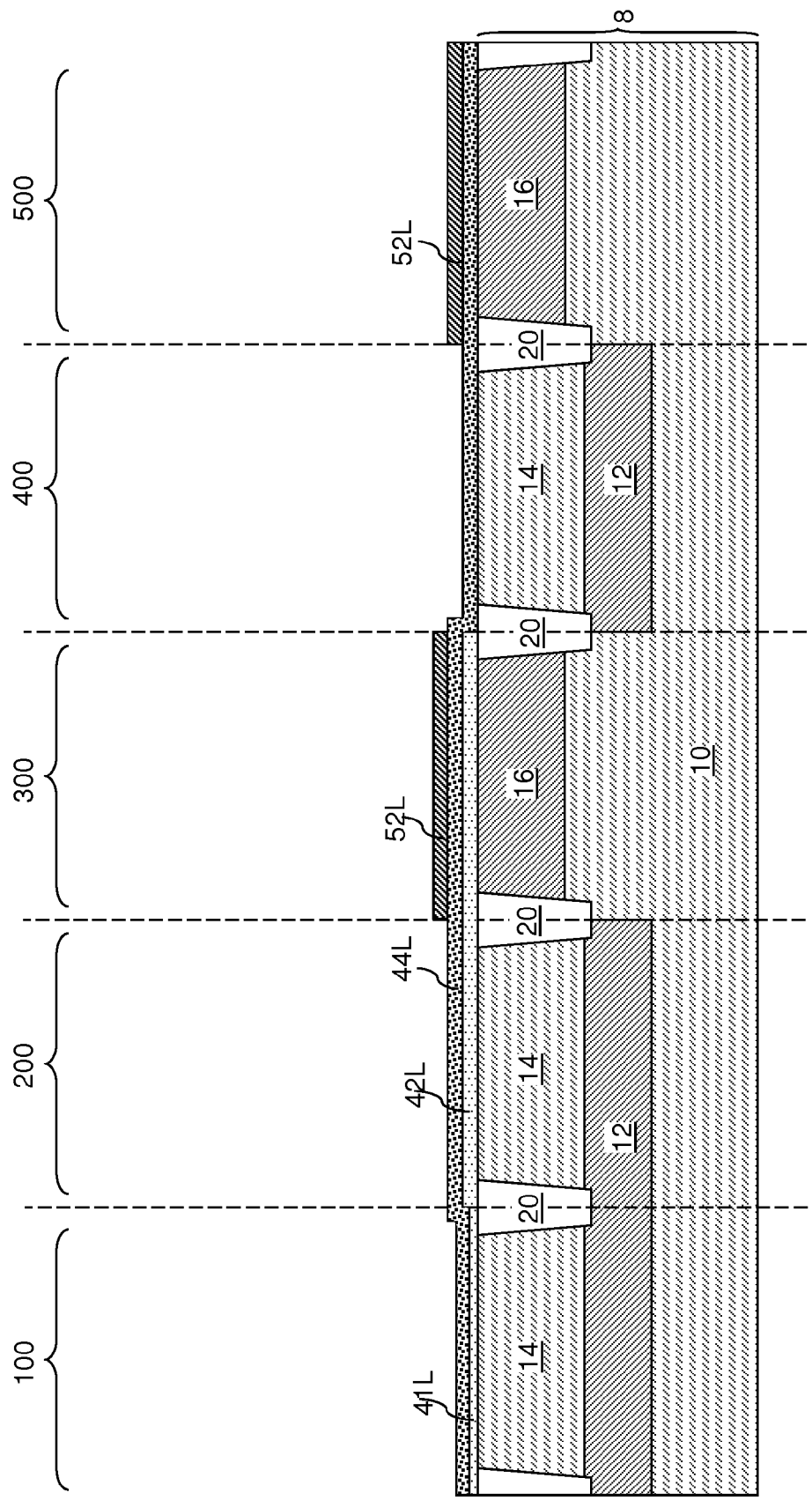
FIG. 2 is a vertical cross-sectional view of the first exemplary semiconductor structure after formation of a high dielectric constant (high-k) gate dielectric layer and deposition and patterning of a first work function material layer according to the first embodiment of the present disclosure.

Referring to FIG. 2, a high dielectric constant (high-k) gate dielectric layer 44L is deposited on exposed top surfaces of the semiconductor substrate 8, the top surface of oxide layer 42L, and the top surface of the optional second oxide layer 41L. The high-k gate dielectric layer 44L includes a material having a "high dielectric constant material." A "high dielectric constant material," or a "high-k dielectric material," herein refers to a dielectric material having a dielectric constant greater than 8.0. The high-k gate dielectric layer 44L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. The high dielectric constant (high-k) gate dielectric layer 44L is deposited as a blanket layer on the entirety of the top surface of the underlying semiconductor structure including the semiconductor substrate 8, the oxide layer 42L, and the optional second oxide layer 41L. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k gate dielectric layer 44 can be from 0.3 nm to 3 nm, and preferably from 0.6 nm to 2 nm, although lesser and greater thicknesses can also be employed.

A first work function material layer 52L is deposited as a blanket layer extending over the entirety of the high-k gate dielectric layer 44L. The first work function material layer 52L is subsequently patterned so that the first work function material layer 52L is present in device regions including second conductivity type wells 16, e.g., the third and fifth device regions (300, 500). The first work function material layer 52L may be in multiple disjoined portions after patterning.

The first work function material layer 52L is a conductive material layer, i.e., a layer including a conductive material. The first work function material layer 52L includes a first metal, which has a first work function. The material of the first work function material layer 52L is selected to optimize the performance of field effect transistors to be subsequently formed in the third and fifth device regions (300, 500).

In one embodiment, the first conductivity type is p-type and the semiconductor material of the second conductivity type wells 16 include n-doped silicon, and the first work function material layer 52L includes a silicon valence band edge metals such as Pt, Rh, Ir, Ru, Cu, Os, Be, Co, Pd, Te, Cr, Ni, TiN, and alloys thereof.

In another embodiment, the first conductivity type is n-type and the semiconductor material of the second conductivity type wells 16 include p-doped silicon, and the first work function material layer 52L includes a silicon conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof.

The first work function material layer 52L can be formed, for example, by physical vapor deposition, chemical vapor deposition, or atomic layer deposition (ALD). The thickness of the first work function material layer 52L can be from 2 nm to 30 nm, and more typically, from 3 nm to 10 nm, although lesser and greater thicknesses can also be employed.

Figure 3:
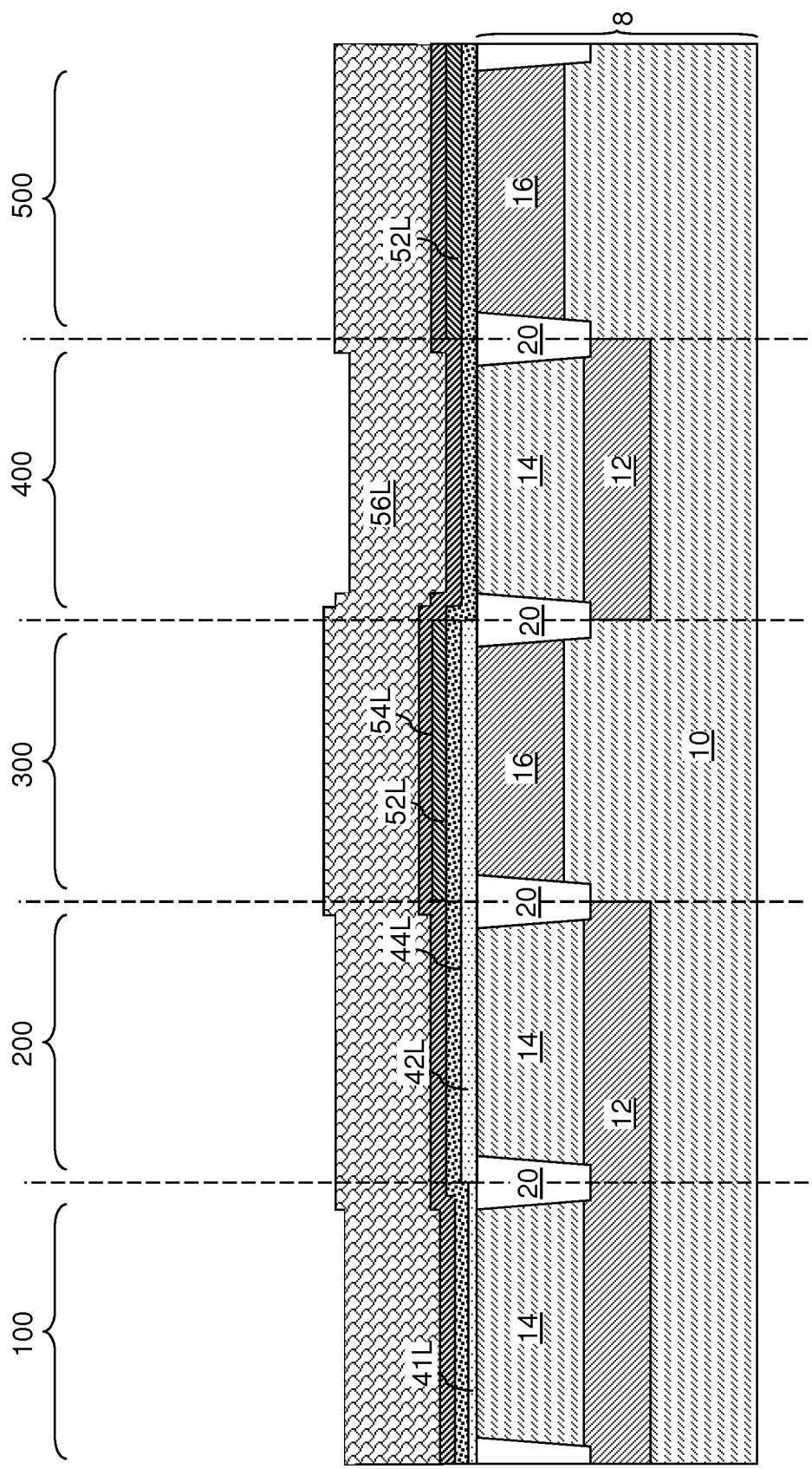
FIG. 3 is a vertical cross-sectional view of the first exemplary semiconductor structure after deposition of a first gate conductor material layer according to the first embodiment of the present disclosure.

Referring to FIG. 3, a second work function material layer 54L and a first gate conductor material layer 54L are deposited on the exposed surfaces of the high-k gate dielectric layer 44L and the patterned first work function material layer 52L. The second work function material layer 54L is deposited as a blanket material layer, for example, by chemical vapor deposition, physical vapor deposition, or a combination thereof.

The second work function material layer 54L is another conductive material layer. The second work function material layer 54L includes a second metal having a second work function, which is different from the first work function. The second metal of the second work function material layer 54L is selected to optimize the performance of field effect transistors to be subsequently formed in the second and fourth device regions (200, 400).

Optionally, the second work function material layer 54L may be patterned to be present only in regions in which field effect transistors of the second conductivity type and a nonvolatile memory device are to be formed.

In one embodiment, the second conductivity type is n-type and the semiconductor material of the first conductivity type wells 14 includes p-doped silicon, and the second work function material layer 54L includes a silicon conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof.

In another embodiment, the second conductivity type is p-type and the semiconductor material of the first conductivity type wells 16 includes n-doped silicon, and the second work function material layer 54L includes a silicon valence band edge metals such as Pt, Rh, Ir, Ru, Cu, Os, Be, Co, Pd, Te, Cr, Ni, TiN, and alloys thereof.

The second work function material layer 54L can be formed, for example, by physical vapor deposition, chemical vapor deposition, or atomic layer deposition (ALD). The thickness of the second-type work function metal layer 52L is typically set at a value from 2 nm to 100 nm, and more typically, from 3 nm to 10 nm, although lesser and greater thicknesses can also be employed.

In one embodiment, one of the first and second work functions is closer to the conduction band of the semiconductor material of the first conductivity type wells 14 and the second conductivity type wells 16 than the valence band of that semiconductor material, and the other of the first and second work functions is closer to the valence band than to the conduction band of that material. Typically, the work function that is closer to the conduction band than to the valence band of the semiconductor material is employed to enhance the performance of an n-type field effect transistor, and the work function that is closer to the valence band than to the conduction band of the semiconductor material is employed to enhance the performance of a p-type field effect transistor.

A first gate conductor material layer 56L is deposited as a blanket layer over the second work function material layer 54L and/or the first work function material layer 52L. The first gate conductor material layer 56L is yet another conductive material layer including a conductive material. The conductive material of the first gate conductor material layer 56L can be a doped semiconductor material, a metallic material, or a combination thereof. The doped semiconductor material, if employed, can be doped polysilicon, doped polycrystalline germanium, a doped silicon-germanium alloy, any other doped elemental or compound semiconductor material, or a combination thereof. The metallic material can be any metallic material that can be deposited by chemical vapor deposition (CVD), physical vapor deposition (PVD), or a combination thereof. For example, the metallic material can include aluminum and/or tungsten. The thickness of the first gate conductor material layer 56L can be from 50 nm to 500 nm, although lesser and greater thicknesses can also be employed.

Figure 4:
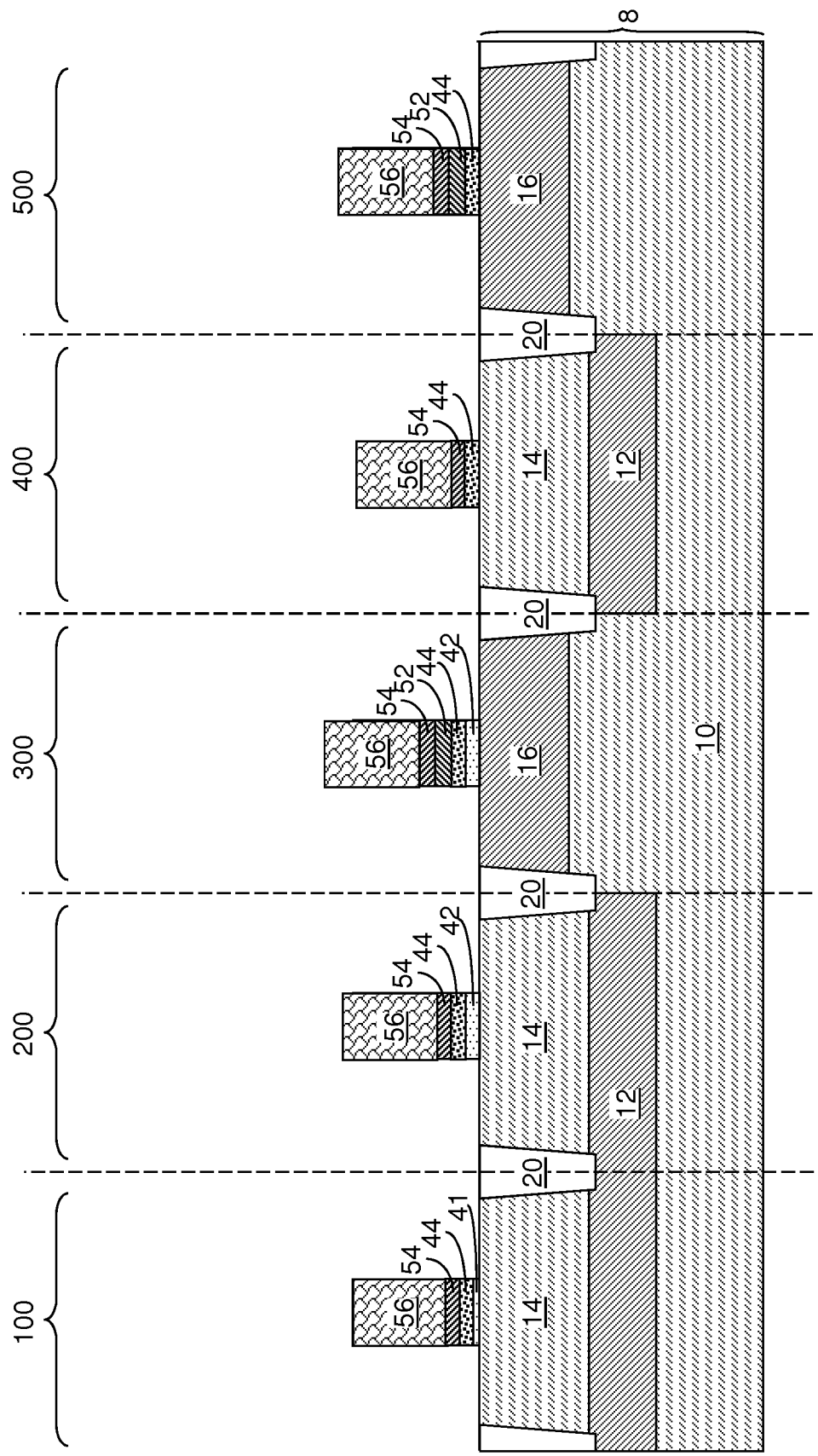
FIG. 4 is a vertical cross-sectional view of the first exemplary semiconductor structure after formation of various gate stack structures according to the first embodiment of the present disclosure.

Referring to FIG. 4, the stack of the first gate conductor material layer 56L, the second work function material layer 54L, the first work function material layer 52L, the high-k gate dielectric layer 44L, the oxide layer 42L, and the second oxide layer 41L are lithographically patterned, for example, by application of a photoresist layer (not shown), lithographic patterning of the photoresist layer, and the transfer of the pattern in the photoresist layer into the stack.

Various gate stack structures are formed from the remaining portions of the stack. For example, a first gate stack structure formed in the first device region 100 includes a vertical stack, from bottom to top, of an optional second oxide portion 41, a high-k gate dielectric portion 44, a second work function material portion 54, and a first gate conductor material portion 56. A second gate stack structure formed in the second device region 200 includes a vertical stack, from bottom to top, of an oxide portion 42, a high-k gate dielectric portion 44, a second work function material portion 54, and a first gate conductor material portion 56. A third gate stack structure formed in the third device region 300 includes a vertical stack, from bottom to top, of an oxide portion 42, a high-k gate dielectric portion 44, a first work function material portion 53, a second work function material portion 54, and a first gate conductor material portion 56. A fourth gate stack structure formed in the fourth device region 400 includes a vertical stack, from bottom to top, of a high-k gate dielectric portion 44, a second work function material portion 54, and a first gate conductor material portion 56. A fifth gate stack structure formed in the fifth device region 500 includes a vertical stack, from bottom to top, of a high-k gate dielectric portion 44, a first work function material portion 52, a second work function material portion 54, and a first gate conductor material portion 56.

In the first device region 100, the combination of the second work function material portion 54 and the first gate conductor material portion 56 constitutes a floating gate electrode structure (54, 56) for a non-volatile memory device to be formed therein. The second work function material portion 54 in the first device region 100 can be a metallic material portion, i.e., a portion including a metallic material. The material of the first gate conductor material portion 56 is a conductive material for the floating gate electrode structure (54, 56), and as such, is herein referred to as a floating gate conductor material portion.

The combination of the high-k gate dielectric portion 44 and the second oxide portion 41, if present, or the high-k gate dielectric portion 44 alone, if a second oxide layer is not present, constitutes a tunnel dielectric (44, 41), which contacts the bottom surface of the floating gate electrode structure (54, 56). The tunnel dielectric (44, 41) includes at least a first dielectric material having a dielectric constant greater than 8.0, i.e., the high dielectric constant material of the high-k gate dielectric layer 44L as deposited at a step illustrated in FIG. 2, and may optionally include an oxide, such as silicon oxide, that has a dielectric constant less than 8.0.

Each of the gate stack structures in the second, third, fourth, and fifth device regions (200, 300, 400, 500) includes a gate electrode structure, which can include a stack of a second work function material portion 54 and a first gate conductor material portion 56 as in the second and fourth device regions (200, 400) or a stack of a first work function material portion 52, a second work function material portion 54, and a first gate conductor material portion 56 as in the third and fifth device regions (300, 500). Each second work function material portion 54 is a metallic material portion, which is herein referred to as a first metallic material portion, having the same composition and thickness as the metallic material portion in the first device region 100, i.e., the second work function material portion 54 in the first device region 100.

Each gate electrode structure (52, 54, 56) in the second, third, fourth, and fifth device regions (200, 300, 400, 500) includes a first gate conductor material portion 56, which is a gate conductor material portion, i.e., a portion including a conductive metal that functions as a gate electrode. The first gate conductor material portion 56 in the first device region 100, which is a floating gate conductor material portion, and the first gate conductor material portion 56 in the second, third, fourth, and fifth device regions (200, 300, 400, 500), which are gate conductor material portions, are formed concurrently by deposition and patterning of a same conductive material, i.e., the conductive material of the first gate conductor material layer 56L.

In each of the second and third device regions (200, 300), the vertical stack of a high-k gate dielectric portion 44 and the oxide portion 42 constitutes a gate dielectric (44, 42), which contacts the bottom surface of the overlying gate electrode structure (52, 54, 56). The gate dielectric (44, 42) includes the first dielectric material in the high-k gate dielectric portion 44 and may the oxide, such as silicon oxide, having a dielectric constant less than 8.0 and present in the oxide portion 42. Thus, each gate dielectric (44, 42) in the second and third device regions (200, 300) includes a stack of a lower gate dielectric portion having a dielectric constant less than 8.0, i.e., the oxide portion 42, and the portion including the first dielectric material.

In each of the fourth and fifth device regions (400, 500), a high-k gate dielectric portion 44 constitutes a gate dielectric which contacts the bottom surface of the overlying gate electrode structure (52, 54, 56). The high-k gate dielectric portion 44 includes the first dielectric material of the high-k gate dielectric layer 44L as deposited at a step illustrated in FIG. 2.

Figure 5:
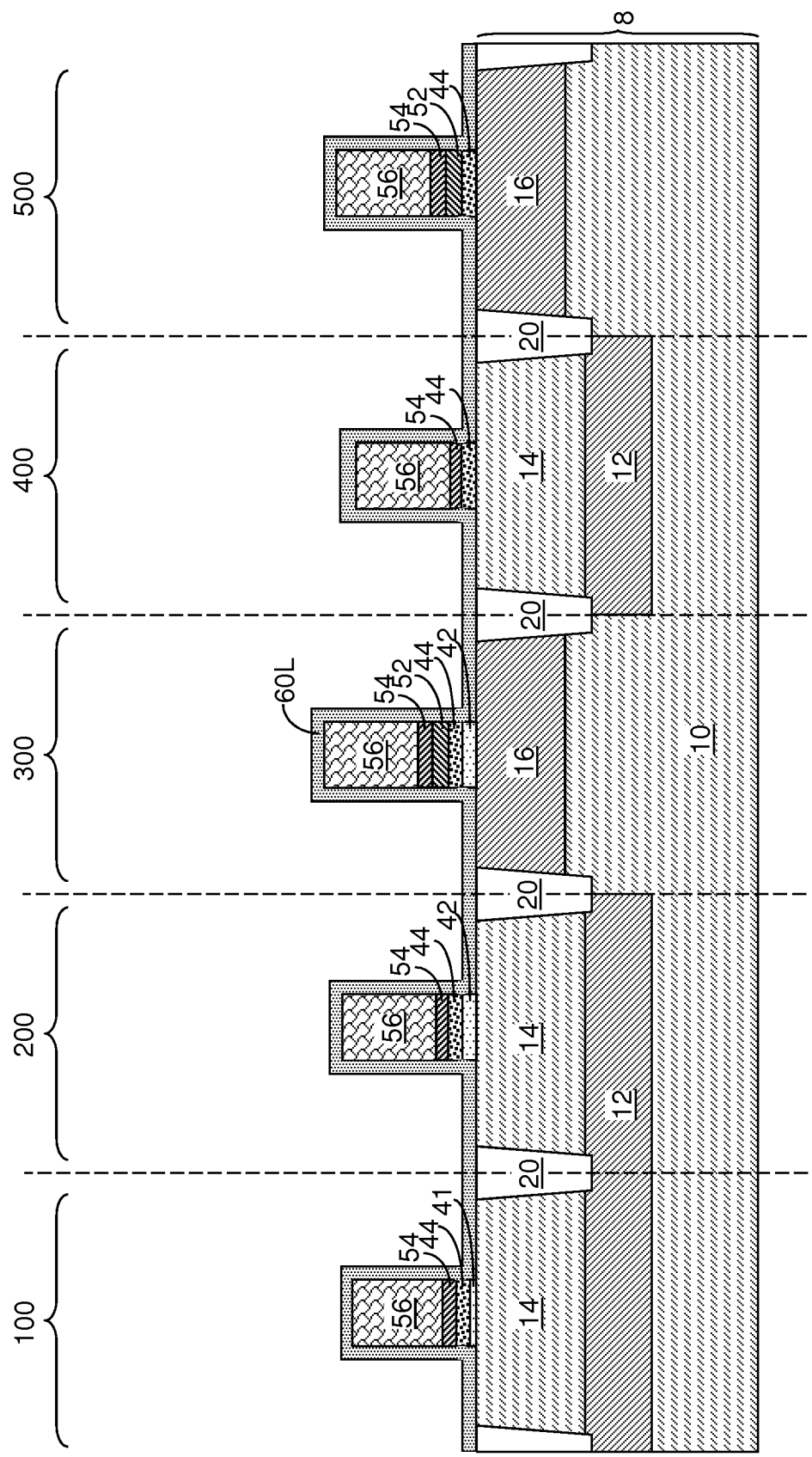
FIG. 5 is a vertical cross-sectional view of the first exemplary semiconductor structure after formation of a conformal dielectric material layer according to the first embodiment of the present disclosure.

Referring to FIG. 5, a conformal dielectric material layer 60L is deposited on the top surfaces and sidewall of the various gate stack structures (41, 42, 44, 52, 54, 56), for example, by chemical vapor deposition (CVD). Thus, the conformal dielectric material layer 60L is deposited directly on a top surface and sidewalls of the floating gate electrode structure (54, 56) in the first device region 100 and the sidewalls of the tunnel dielectric (41, 44). The conformal dielectric material layer 60L includes a second dielectric material. In one embodiment, the second dielectric material can include silicon oxide, silicon nitride, silicon oxynitride, or a combination thereof. The thickness of the conformal dielectric material layer 60L can be the same in vertical portions and horizontal portions, and can be from 1.5 nm to 10 nm, although lesser and greater thicknesses can also be employed.

Figure 6:
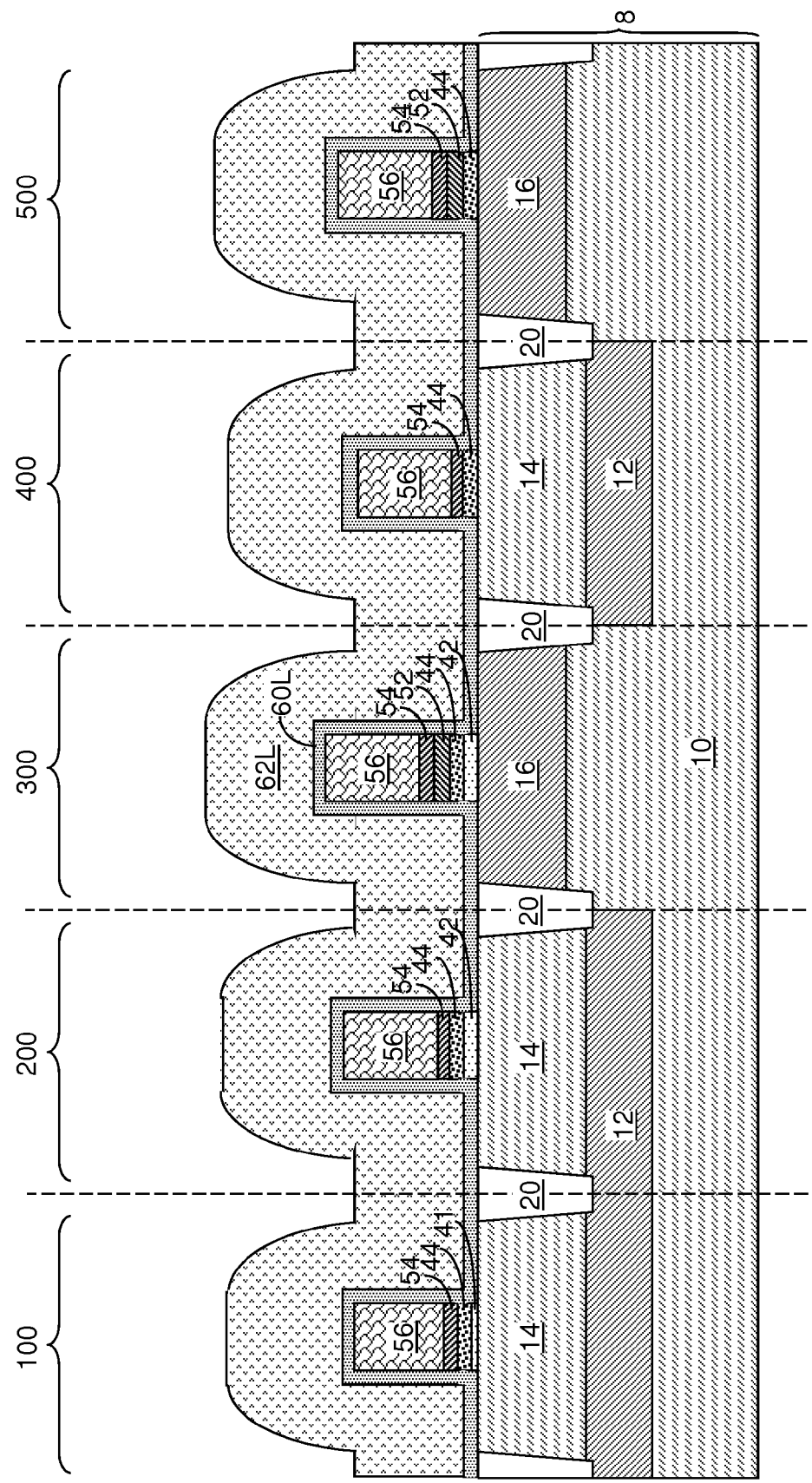
FIG. 6 is a vertical cross-sectional view of the first exemplary semiconductor structure after deposition of a disposable gate material layer according to the first embodiment of the present disclosure.

Referring to FIG. 6, a disposable gate material layer 62L is deposited, for example, by chemical vapor deposition (CVD) or physical vapor deposition (PVD). The disposable gate material layer 62L includes a material that can be removed selective to dielectric materials of gate spacers and a planarization dielectric layer to be subsequently formed. In one embodiment, the disposable gate material layer 62L can include a polycrystalline or amorphous semiconductor material, which can be silicon, germanium, a silicon-germanium alloy, any other elemental or compound semiconductor material, or a combination thereof. In another embodiment, the disposable gate material layer 62L can include a dielectric material that can be removed selective to the dielectric material of the conformal dielectric material layer 60L, and can include organosilicate glass (OSG), silicon oxide, or silicon nitride. The thickness of the disposable gate material layer, as measured in a planar portion above a shallow trench isolation structure 20, can be from 150 nm to 300 nm, although lesser and greater thicknesses can also be employed.

Figure 7:
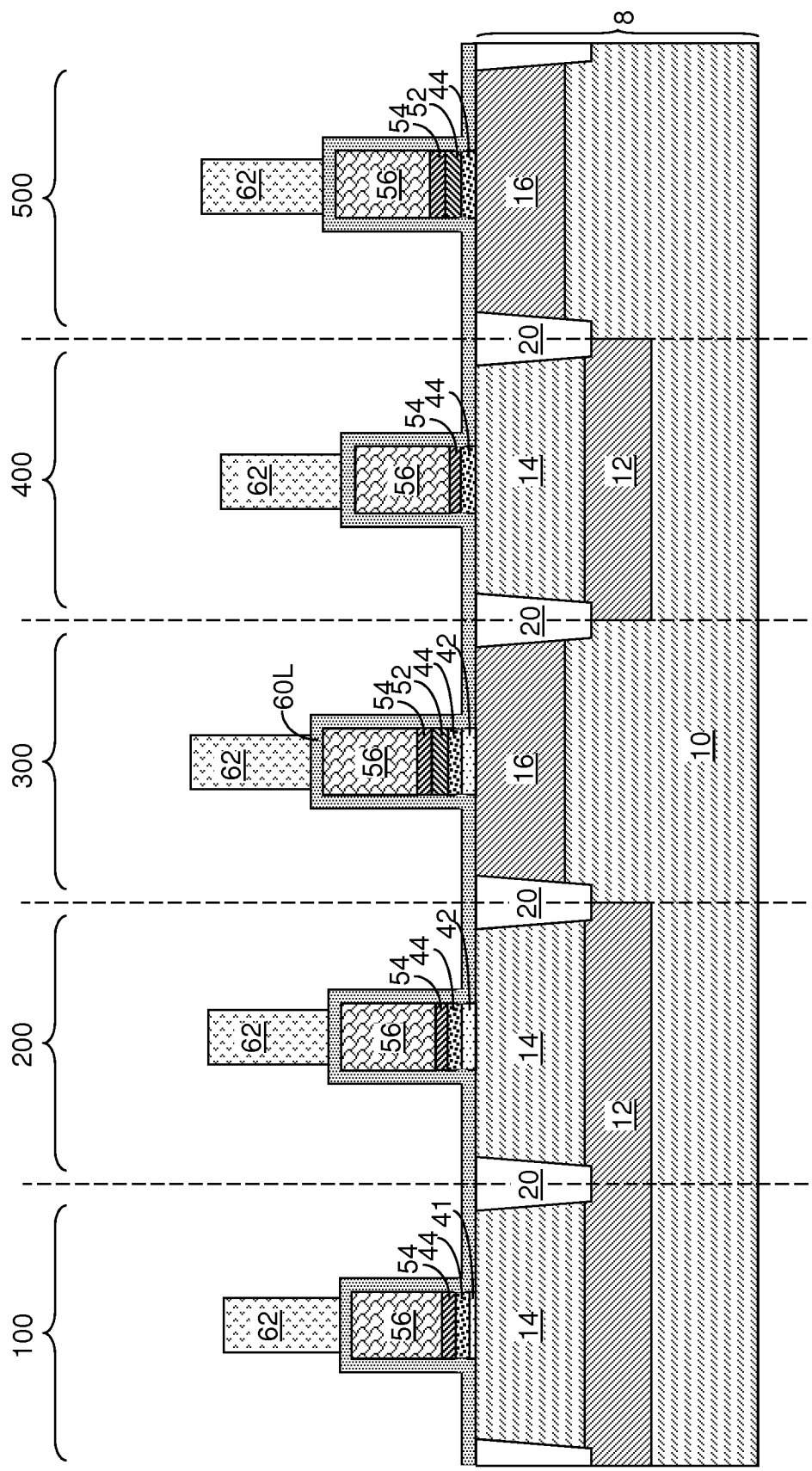
FIG. 7 is a vertical cross-sectional view of the first exemplary semiconductor structure after patterning of the disposable gate material layer to form various disposable gate material portions according to the first embodiment of the present disclosure.

Referring to FIG. 7, the disposable gate material layer 62L is lithographically patterned, for example, by application of a photoresist layer (not shown) over the disposable gate material layer 62L, lithographic patterning of the photoresist layer, and transfer of the pattern in the photoresist layer into the disposable gate material layer 62L by an anisotropic etch employing remaining portions of the photoresist layer as an etch mask. Various disposable gate material portions 62 are formed above planar portions of the conformal dielectric material layer 60L above the various first gate conductor material portions 62. In the first device region 100, a disposable gate material portion 62 is formed over a portion of the conformal dielectric material layer 60L located above the floating gate electrode structure (54, 56). In each of the second, third, fourth, and fifth device regions (200, 300, 400, 500), a disposable gate material portion 62 is formed over a portion of the conformal dielectric material layer 60L located above the gate electrode structure (52, 54, 56). In one embodiment, the width of each disposable gate material portion 62 can be less than the width of the underlying floating gate electrode structure (54, 56) or the underlying gate electrode structure (52, 54, 56) to ensure that no portion of the disposable gate material layer 62L remains on the sidewalls of the conformal dielectric material layer 60L.

Figure 8:
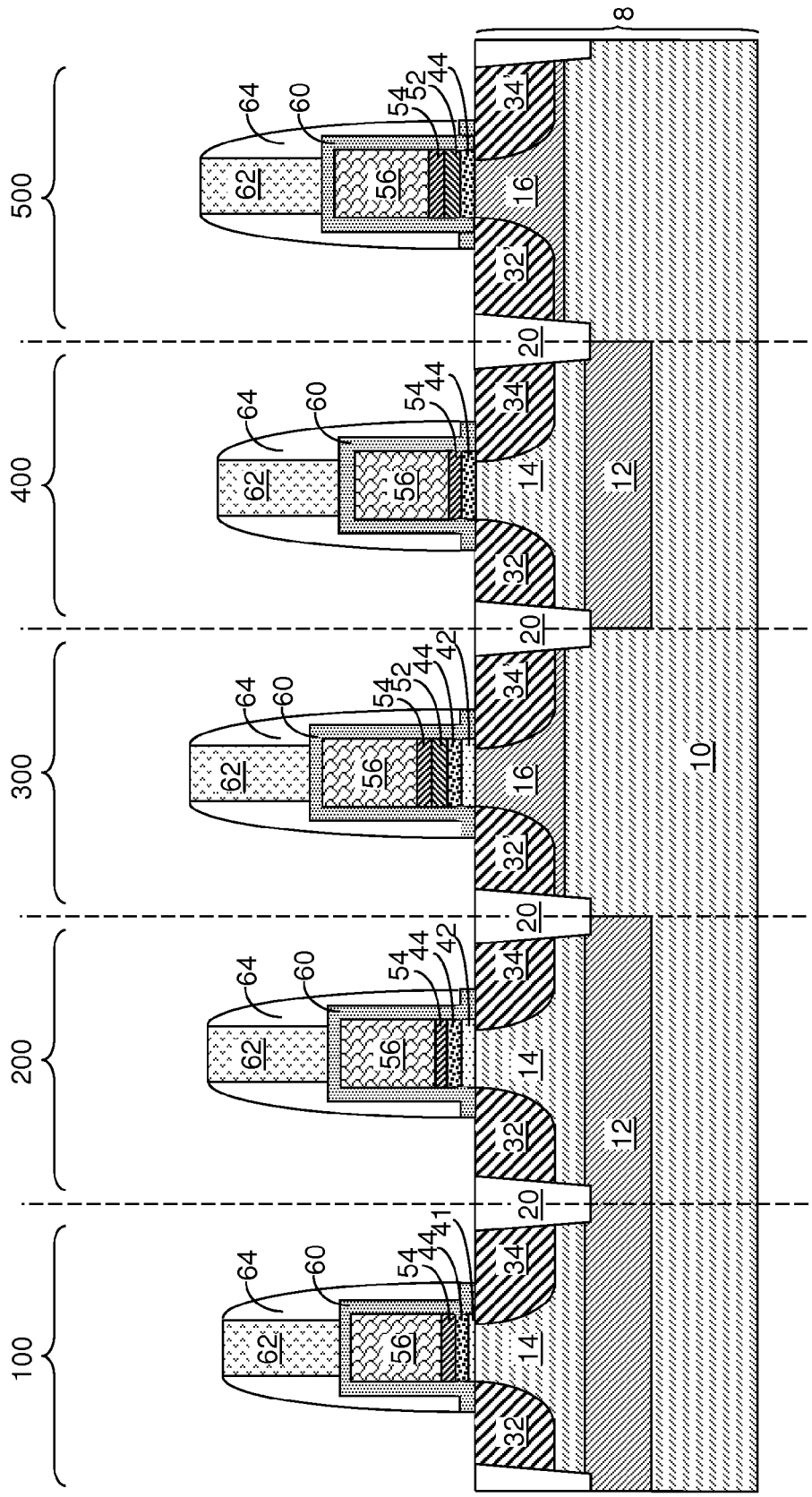
FIG. 8 is a vertical cross-sectional view of the first exemplary semiconductor structure after formation of gate spacers according to the first embodiment of the present disclosure.

Referring to FIG. 8, gate spacers 64 are formed on sidewalls of the conformal dielectric material layer 64. The gate spacers 64 include a dielectric material such as silicon oxide, silicon nitride, silicon oxynitride, or a combination thereof. The dielectric material of the gate spacers 64 different from the material of the disposable gate material portions 62. The gate spacers 64 can be formed by conformal deposition of a dielectric material layer, for example, by chemical vapor deposition (CVD), followed by an anisotropic etch that removes the horizontal portions of the dielectric material layer.

After formation of the gate spacers 64, the exposed portions of the conformal dielectric material layer 60L, i.e., the portions of the conformal dielectric material layer 60L that are not covered by the gate spacers 64 or the disposable gate material portions 62, are removed by an etch, which can be a wet etch or a dry etch. The remaining portions of the conformal dielectric material layer 60L are disjoined from one another, i.e., not contiguous with other remaining portions of the conformal dielectric material layer 60L, and are herein referred to as conformal dielectric material portions 60. The portions of the conformal dielectric material layer 60L that are removed by the wet etch or the dry etch are horizontal portions that contact a top surface of the semiconductor substrate 8. The conformal dielectric material portion 60 in the first device region 100, i.e., the remaining portion of the conformal dielectric material layer 60L in the first device region 100, is herein referred to as a control gate dielectric that functions as a gate dielectric for a control gate structure for a non-volatile memory device to be subsequently formed.

Various masked ion implantations can be performed to implant dopants of the first conductivity type or dopants of the second conductivity type into various regions of the first conductivity type wells 14 and the second conductivity type wells 16. Specifically, dopants of the second conductivity type are implanted into regions of the first conductivity type wells 14 that are not covered by a stack of a gate electrode structure (52, 54, 56) and a disposable gate material portion or by the gate spacers 64 so as to form various second-conductivity-type source regions 32 and various second-conductivity-type drain regions 34. Further, dopants of the first conductivity type are implanted into regions of the second conductivity type wells 16 that are not covered by a stack of a gate electrode structure (52, 54, 56) and a disposable gate material portion or by the gate spacers 64 so as to form various first-conductivity-type source regions 32' and various first-conductivity-type drain regions 34'.

Figure 9:
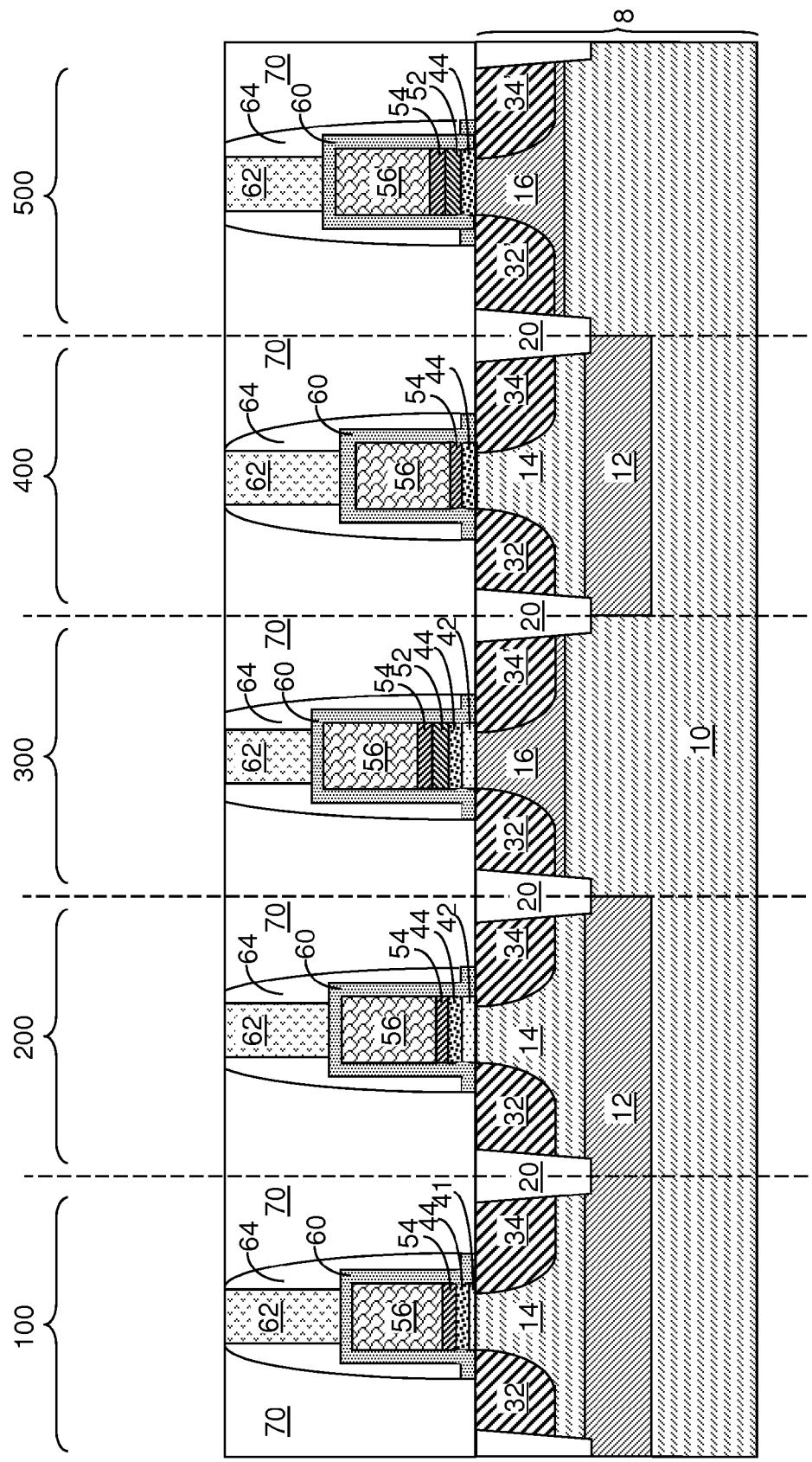
FIG. 9 is a vertical cross-sectional view of the first exemplary semiconductor structure after deposition and planarization of a planarization dielectric layer according to the first embodiment of the present disclosure.

Referring to FIG. 9, a planarization dielectric layer 70 is deposited over the disposable gate material portions 62, the gate spacers 64, and the exposed surfaces of the semiconductor substrate 8. The planarization dielectric layer 70 includes a dielectric material such as silicon oxide, silicon nitride, silicon oxynitride, or a combination thereof. The dielectric material of the planarization dielectric layer 70 different from the material of the disposable gate material portions 62. The planarization dielectric layer 70 can be deposited, for example, by chemical vapor deposition (CVD).

The planarization dielectric layer 70 is subsequently planarized, for example, by chemical mechanical planarization (CMP), recess etch, or a combination thereof. In one embodiment, the various disposable gate material portions 62 and/or the gate spacers 64 can be employed as a stopping layer for the planarization process. The top surface of the planarization dielectric layer 70 as planarized is coplanar with the top surfaces of the remaining portions of the disposable gate material portions 62 and the gate spacers 64.

Figure 10:
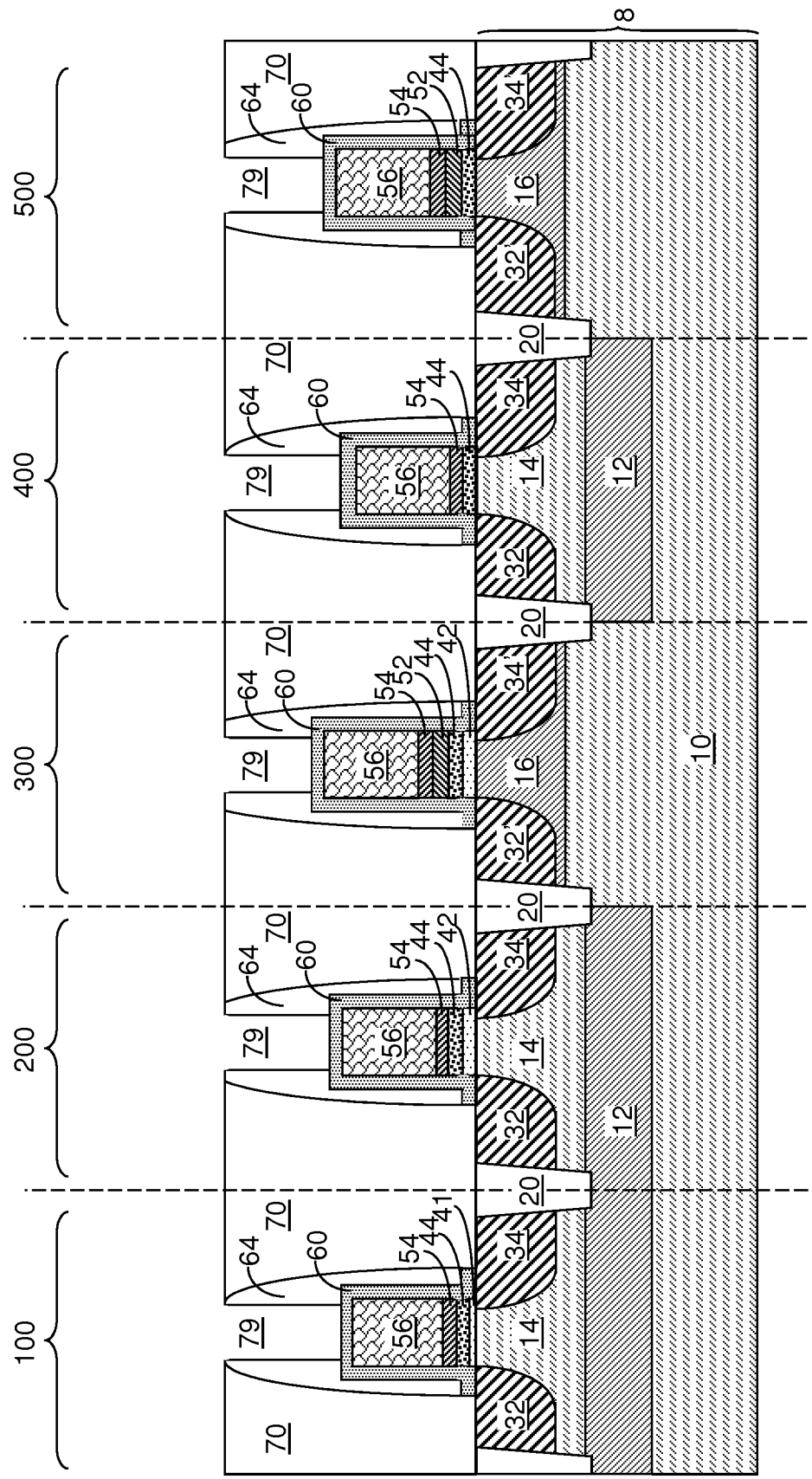
FIG. 10 is a vertical cross-sectional view of the first exemplary semiconductor structure after removal of the various disposable gate material portions according to the first embodiment of the present disclosure.

Referring to FIG. 10, the various disposable gate material portions 62 are removed selective to the materials of the planarization dielectric layer 70, the gate spacers 64, and the conformal dielectric material portions 60, which are different from the material of the disposable gate material portions 62. A wet etch or a dry etch is employed that removes the material of the disposable gate material portions 62 selective to the materials of the planarization dielectric layer 70, the gate spacers 64, and the conformal dielectric material portions 60. For example, if the disposable gate material portions 62 include a semiconductor material, a wet etch or a dry etch is employed to remove the semiconductor material selective to the dielectric materials of the planarization dielectric layer 70, the gate spacers 64, and the conformal dielectric material portions 60. A gate cavity 79 is formed in each volume from which a disposable gate material portion 62 is employed.

Figure 11:
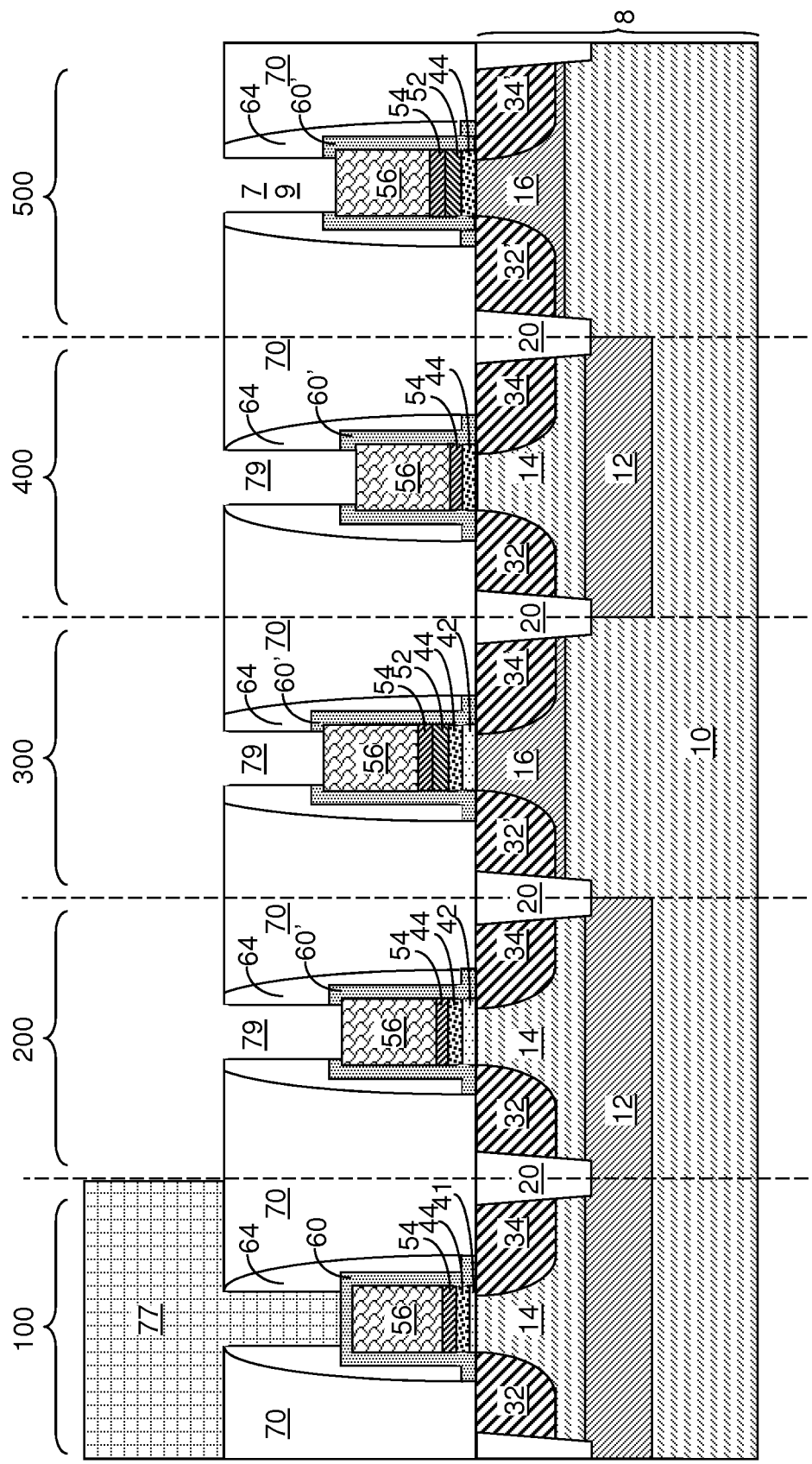
FIG. 11 is a vertical cross-sectional view of the first exemplary semiconductor structure after removal of exposed top portions of conformal dielectric material portions from single gate device regions, while preventing removal of a control gate dielectric from a non-volatile memory device region according to the first embodiment of the present disclosure.

Referring to FIG. 11, a photoresist layer 77 is applied over the planarization dielectric layer 70, and is lithographically patterned by lithographic exposure and development. The patterned photoresist layer 77 is present in a device region in which a non-volatile memory device is to be formed, i.e., in the first device region, but is not present in device regions in which filed effect transistors having a single gate dielectric are to be formed, i.e., in the second, third, fourth, and fifth device regions (200, 300, 400, 500). The exposed portions of the conformal dielectric material portions 60 in the second, third, fourth, and fifth device regions (200, 300, 400, 500) are etched by a wet etch or a dry etch. Thus, exposed top portions of conformal dielectric material portions 60 are removed from single gate device regions such as second, third, fourth, and fifth device regions (200, 300, 400, 500), while preventing removal of a control gate dielectric, i.e., the conformal dielectric material portion 60 in the first device region 100, from a non-volatile memory device region such as the first device region 100.

In one embodiment, the exposed portions of the conformal dielectric material portions 60 can be removed selective to the dielectric materials of the planarization dielectric layer 70 and the gate spacers 64. In another embodiment, the exposed portions of the conformal dielectric material portions 60 and surface portions of the dielectric materials of the planarization dielectric layer 70 and the gate spacers 64 can be removed, provided that the amount of removal from the planarization dielectric layer 70 and the gate spacers 64 is not excessive and the lower portion of each gate cavity 79 does not extend to sidewalls of the conformal dielectric material portions 60.

The remaining portion in each conformal dielectric material portion 60 in the second, third, fourth, and fifth device regions (200, 300, 400, 500) is herein referred to as a first gate spacer 60', which laterally contacts all sidewalls of a gate dielectric (44, 42) and a gate electrode structure (52, 54, 56). To distinguish from the first gate spacer 60', the gate spacer 64 is herein referred to as a second gate spacer. As discussed above, each gate dielectric (44, 42) can include a vertical stack of a high-k gate dielectric portion 44 and an oxide portion 42 or consist of a high-k gate dielectric portion 44, and each gate electrode structure (52, 54, 56) can include a stack of a second work function material portion 54 and a first gate conductor material portion 56 as in the second and fourth device regions (200, 400) or a stack of a first work function material portion 52, a second work function material portion 54, and a first gate conductor material portion 56 as in the third and fifth device regions (300, 500). The patterned photoresist layer 77 is subsequently removed, for example, by ashing.

Figure 12:
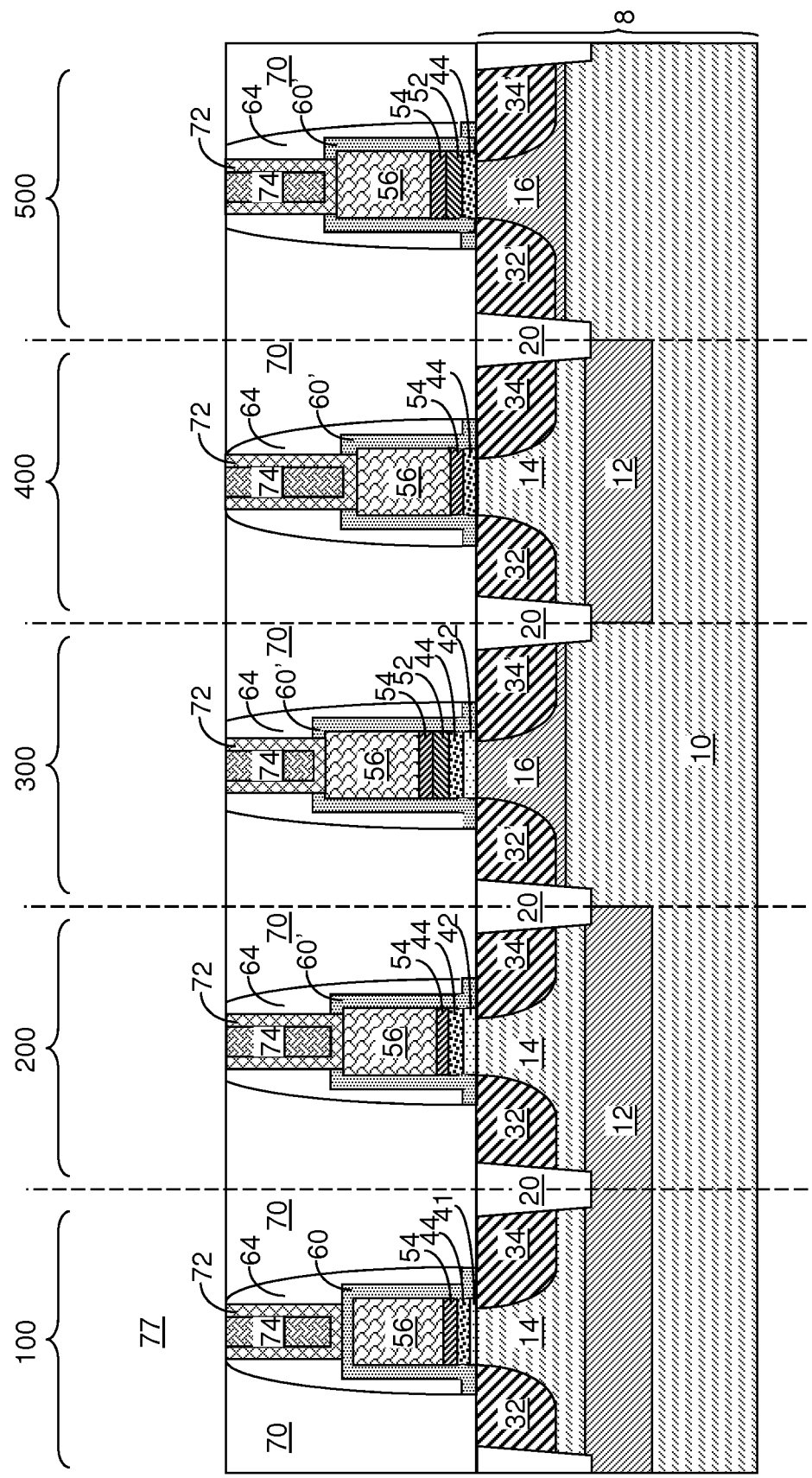
FIG. 12 is a vertical cross-sectional view of the first exemplary semiconductor structure after formation of replacement conductive material portions according to the first embodiment of the present disclosure.

Referring to FIG. 12, replacement conductive material portions are formed in the gate cavities 79, for example, by deposition of at least one conductive material layer and subsequent planarization of the material(s) of at least one conductive material layer. The at least one conductive material layer can include, for example, a metallic barrier layer and a conductive material layer. The excess portion of the metallic barrier layer and the conductive material layer deposited over the top surface of the planarization dielectric layer 70 is removed during planarization. Each gate cavity 79 is filled with a stack of a metallic material portion 72 and a second gate conductor material portion 74. Each metallic material portion 72 is a remaining portion of the metallic barrier layer after the planarization, and each second gate conductor material portion 74 is a remaining portion of the conductive material layer.

The metallic material portions 72 can include any metallic material such as an elemental metal, a conductive metal nitride, a conductive metal oxide, a conductive metal oxynitride, an alloy thereof, or any stack of the foregoing. The second gate conductor material portions 74 can include any conductive material, which can be a metallic material or a doped semiconductor material. While the present disclosure is described employing metallic material portions 72, embodiments in which the metallic material portions 72 are omitted and the second gate conductor material portions 74 directly contact first gate conductor material portion 56 in the second, third, fourth, and fifth device regions (200, 300, 400, 500) or the control gate dielectric, which is the conformal dielectric material portion 60 located within the first device region 100.

The stack of a metallic material portion 72 and a second gate conductor material portion 74 in the first device region 100 is formed directly on the control gate dielectric and contiguously covers the entirety of the top surface of the floating gate electrode structure (54, 56) in the first device region 100. Thus, the stack of a metallic material portion 72 and a second gate conductor material portion 74 in the first device region 100 is herein referred to as a control gate electrode structure (72, 74), i.e., an electrode structure that functions as the control gate for the non-volatile memory device to be formed in the first device region 100.

Each gate electrode structure (52, 54, 56) in the second, third, fourth, and fifth device regions (200, 300, 400, 500) are extended to include additional conductive materials of the overlying stack of a metallic material portion 72 and a second gate conductor material portion 74. Each stack of a metallic material portion 72 and a second gate conductor material portion 74 in the second, third, fourth, and fifth device regions (200, 300, 400, 500) is herein referred to as an upper gate electrode portion, and each stack of a second work function material portion 54 and a first gate conductor material portion 56 and optionally a first work function material portion 52 is herein referred to as a lower gate electrode portion.

The floating gate electrode (54, 56) in the first device region 100 and each lower gate electrode portion can include a second work function material portion 54, which is a metallic material portion. The second work function material portions 54 are herein referred to as first metallic material portions. All first metallic material portions have the same thickness and composition.

If the metallic material portions 72 are present or if the second gate conductor material portions 74 include a metallic material, the control gate electrode structure (72, 74) in the first device region 100 and each upper gate electrode portion can include another metallic material portion, which is herein referred to as a second metallic material portion. The second metallic material portions can be the metallic material portions 72 or second gate conductor material portions 74 including a metallic material. All second metallic material portions have the same thickness (as measured at horizontal portions thereof) and composition.

After planarization, each metallic material portion 72 and each second gate conductor material portion 74 can have topmost surfaces that are coplanar with the top surface of the planarization dielectric layer 70.

The first device region 100 includes a non-volatile memory device that includes a field effect transistor having a tunnel dielectric and a control gate dielectric. The tunnel dielectric can include a stack of tack of the high-k gate dielectric portion 44 and the second oxide portion 41 in the first device region 100 or can consist of the high-k gate dielectric portion 44 in the first device region 100. The tunnel dielectric includes the first dielectric material having a dielectric constant greater than 8.0, i.e., the dielectric material of the high-k gate dielectric portion 44.

The field effect transistor in the first device region 100 includes a floating gate electrode structure, which is a stack of the second work function material portion 54 and the first gate conductor material portion 56 located in the first device region 100.

The control gate dielectric is the conformal dielectric material portions 60 in the first device region 100. The control gate dielectric contacts the floating gate electrode structure and includes a second dielectric material, i.e., the dielectric material of the conformal dielectric material portions 60. The control gate dielectric contiguously extends from the top surface of the floating gate electrode structure (54, 56) to the tunnel dielectric (44, 41) along sidewalls of the floating gate electrode structure (54, 56). The gate spacer 64, or the second gate spacer, in the first device region 100 contacts outer sidewalls of the control gate dielectric, i.e., the conformal dielectric material portions 60, and sidewalls of the control gate electrode structure (54, 56).

Figure 13:
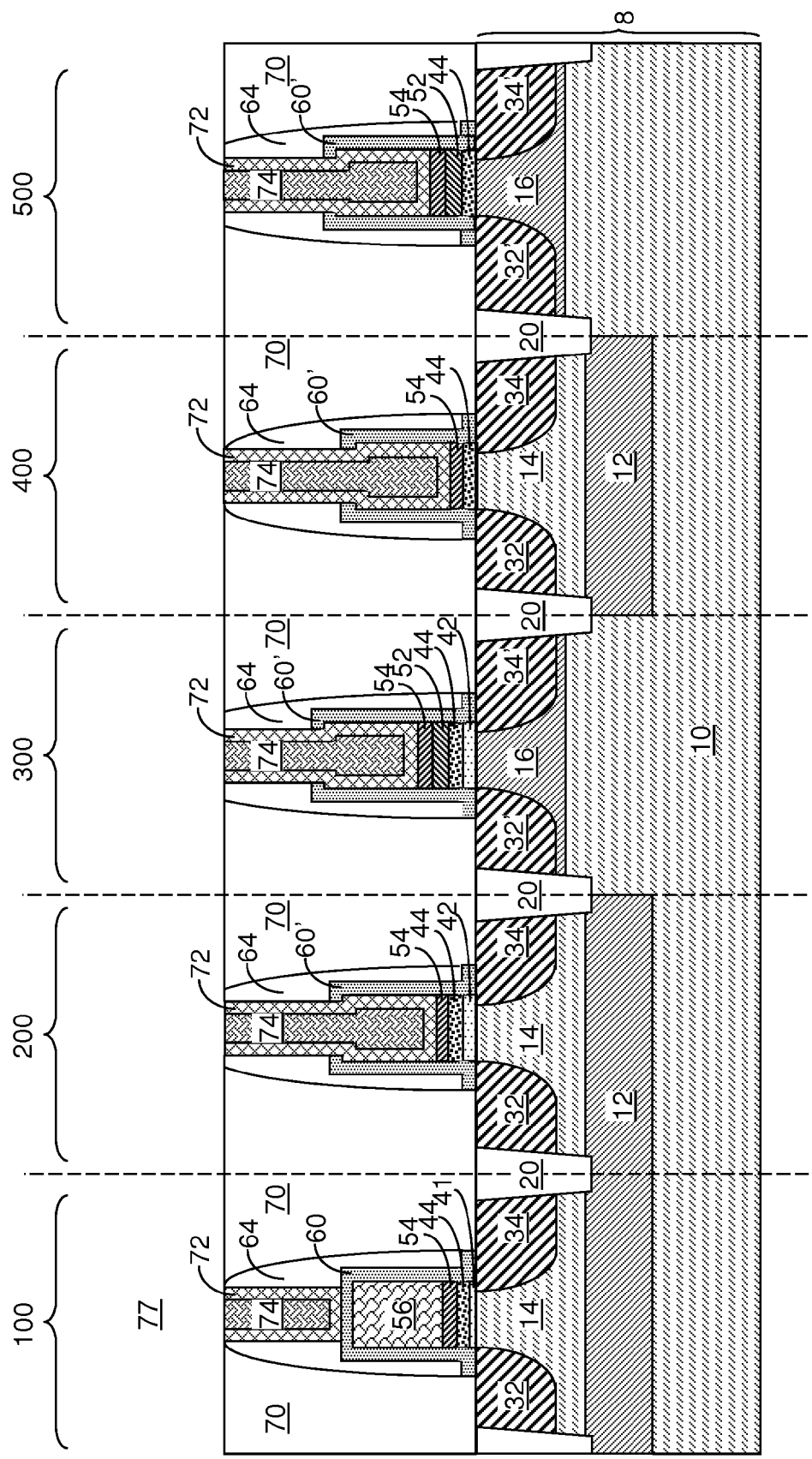
FIG. 13 is a vertical cross-sectional view a second exemplary semiconductor structure according to a second embodiment of the present disclosure.

Referring to FIG. 13, a second exemplary semiconductor structure according to a second embodiment of the present disclosure is derived from the first exemplary semiconductor structure of FIG. 11 by removing the first gate conductor material portions 56 prior to removal of the photoresist layer 77. The processing steps of FIG. 12 are performed in the same manner as in the first embodiment. In the second exemplary semiconductor structure, the volumes of the first gate conductor material portions 56 in the second, third, fourth, and fifth device regions (200, 300, 400, 500) are replaced with sub-portions of the metallic material portions 72 and the second gate conductor material portions 74.

Figure 14:
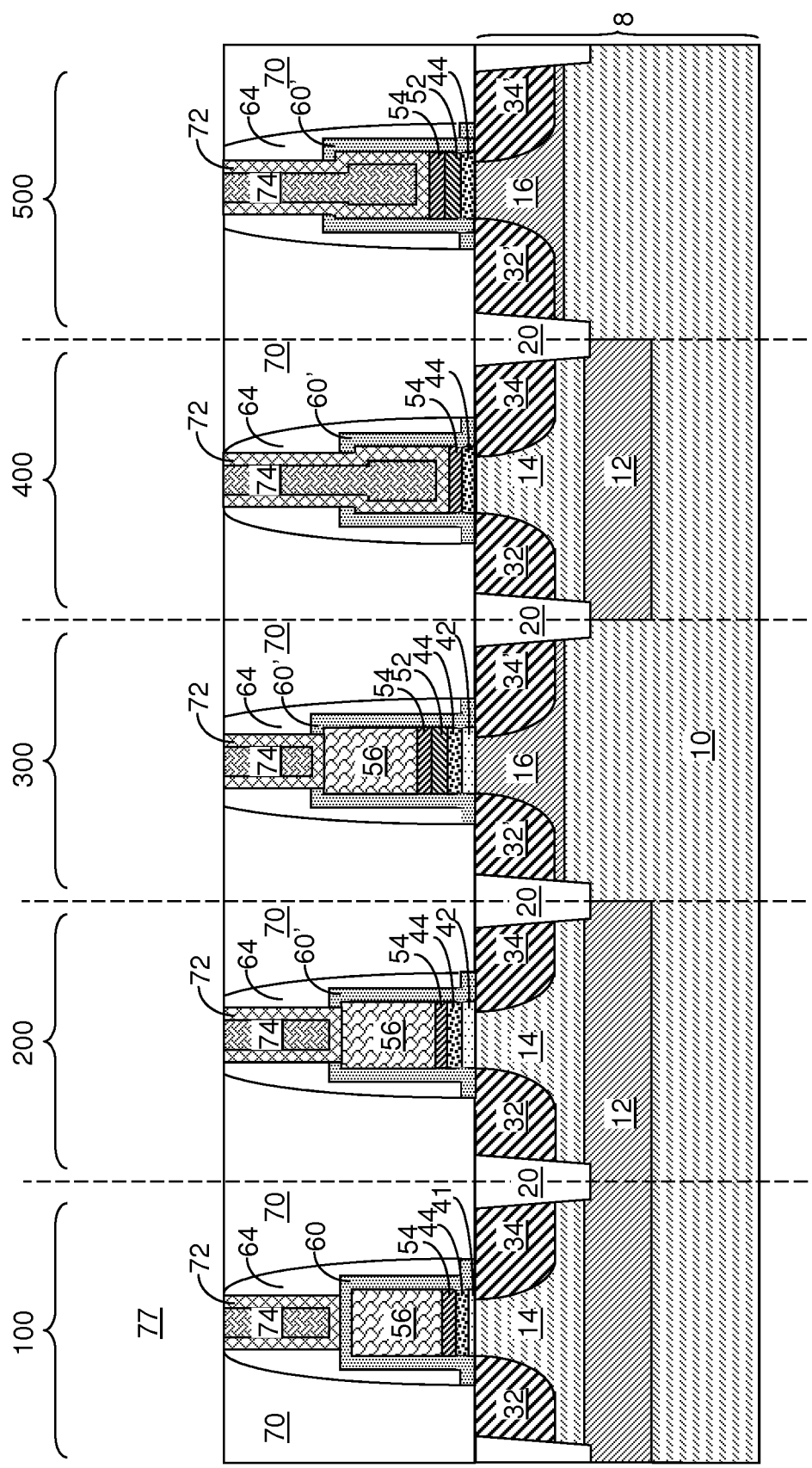
FIG. 14 is a vertical cross-sectional view of a third exemplary semiconductor structure according to a third embodiment of the present disclosure.

Referring to FIG. 14, a third exemplary semiconductor structure according to a third embodiment of the present disclosure is derived from the first exemplary semiconductor structure of FIG. 11 by employing another patterned photoresist layer between the processing steps of FIG. 11 and the processing steps of FIG. 12. Specifically, after removal of the patterned photoresist layer 77, a second photoresist layer is applied over the planarization dielectric layer 70 and is lithographically patterned to cover the first, second, and third device regions (100, 200, 300), while exposing the gate cavities 79 in the fourth and fifth device regions (400, 500). The first gate conductor material portions 56 in the fourth and fifth device regions (400, 500) are removed prior to removing the second photoresist layer. The processing steps of FIG. 12 are performed in the same manner as in the first embodiment. In the third exemplary semiconductor structure, the volumes of the first gate conductor material portions 56 in the fourth and fifth device regions (200, 300, 400, 500) are replaced with sub-portions of the metallic material portions 72 and the second gate conductor material portions 74.

Figure 15:
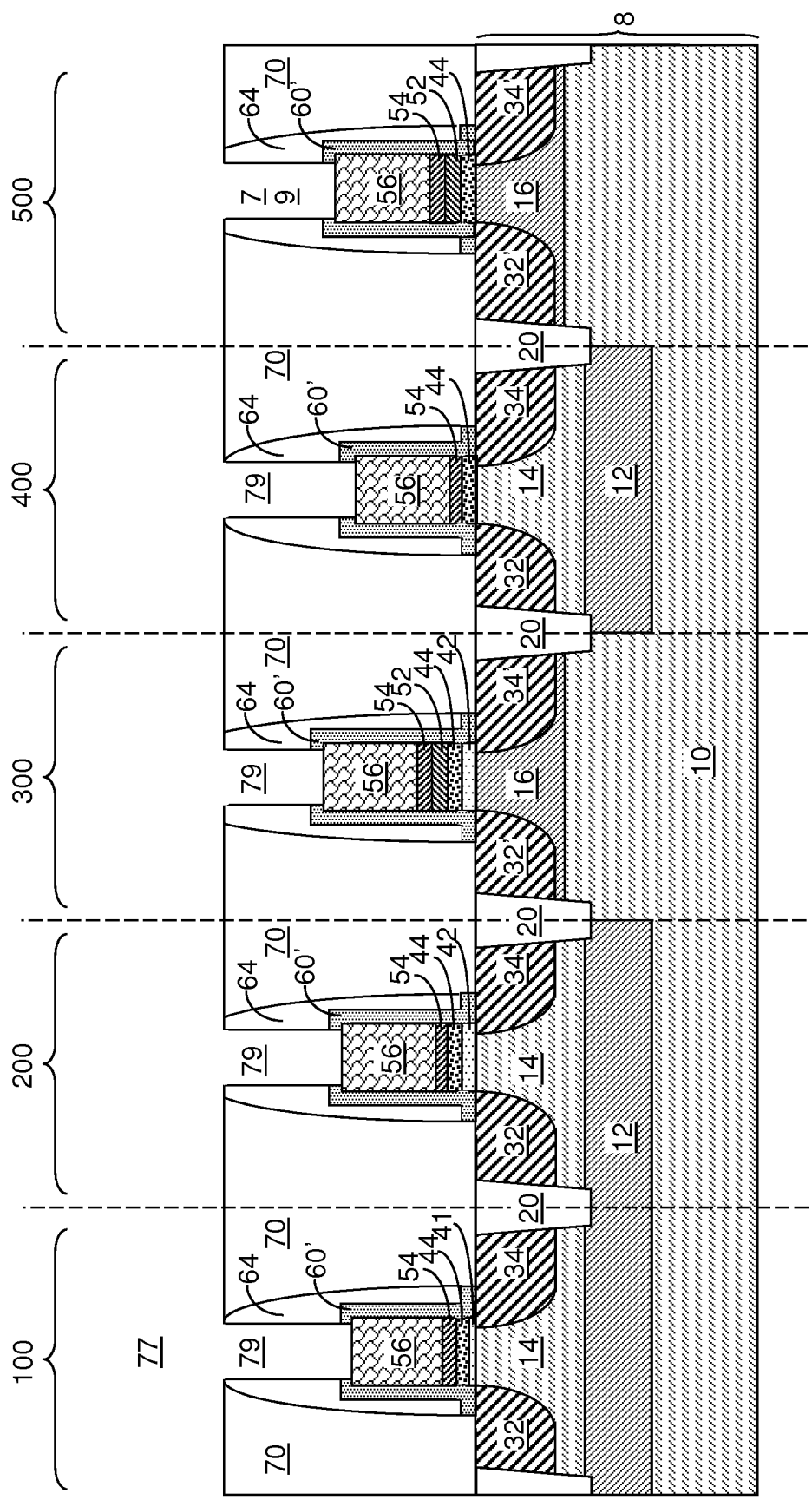
FIG. 15 is a vertical cross-sectional view of a fourth exemplary semiconductor structure after removal of exposed top portions of conformal dielectric material portions according to a fourth embodiment of the present disclosure.

Referring to FIG. 15, a fourth exemplary semiconductor structure according to a fourth embodiment of the present disclosure is derived from the first exemplary semiconductor structure of FIG. 10 by removing all exposed top portions of conformal dielectric material portions 60 in the first, second, third, fourth, and fifth device regions (100, 200, 300, 400, 500). The top surface of the control gate electrode structure (54, 56) is exposed in an opening in the conformal dielectric material layer 60 in the first device region 100. Likewise, the top surface of each gate electrode structure (52, 54, 56) are exposed in the second, third, fourth, and fifth device regions (200, 300, 400, 500). The remaining portion of each conformal dielectric material layer 60 is herein referred to as a first gate spacer 60'. A first gate spacer 60' in the first device region 100 contacts the sidewalls of the control gate electrode structure (54, 56) and a tunnel dielectric (44, 41) in the first device region. Each first gate spacer 60' in the second, third, fourth, and fifth device region (200, 300, 400, 500) contacts sidewalls of a gate electrode structure (52, 54, 56) and sidewalls of a gate dielectric (44, 42).

Figure 16:
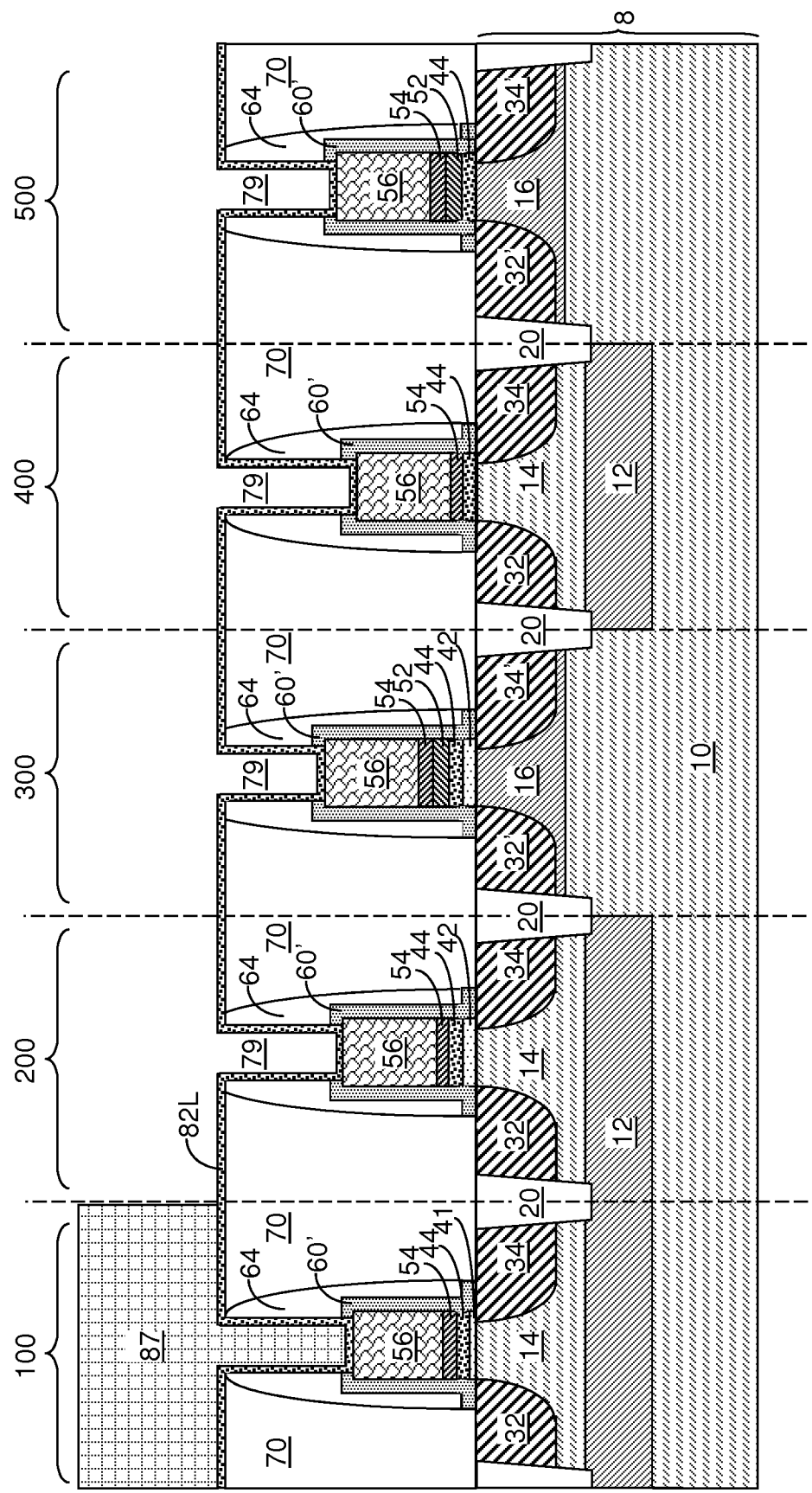
FIG. 16 is a vertical cross-sectional view of the fourth exemplary semiconductor structure after deposition of a second high-k control gate dielectric layer and application and patterning of a photoresist according to the fourth embodiment of the present disclosure.

Referring to FIG. 16, a second high-k gate dielectric layer 82L is deposited on the top surface of the planarization dielectric layer 70, on the top surfaces and sidewalls of the gate spacers 60, and the top surfaces of the first gate conductor material portions 56. The second high-k gate dielectric layer 82L can have the same composition and thickness as the high-k gate dielectric layer 54L, and can be deposited employing the same method as the high-k gate dielectric layer 54L.

A photoresist layer 87 is applied over the second high-k gate dielectric layer 82L, and is lithographically patterned to cover the portion of the second high-k gate dielectric layer 82L in the first device region 100, while exposing the portion of the second high-k gate dielectric layer 82L in the second, third, fourth, and fifth device regions (200, 300, 400, 500). The exposed portions of the second high-k gate dielectric layer 82L are removed, for example, by an etch, which can be a wet etch or a dry etch.

Figure 17:
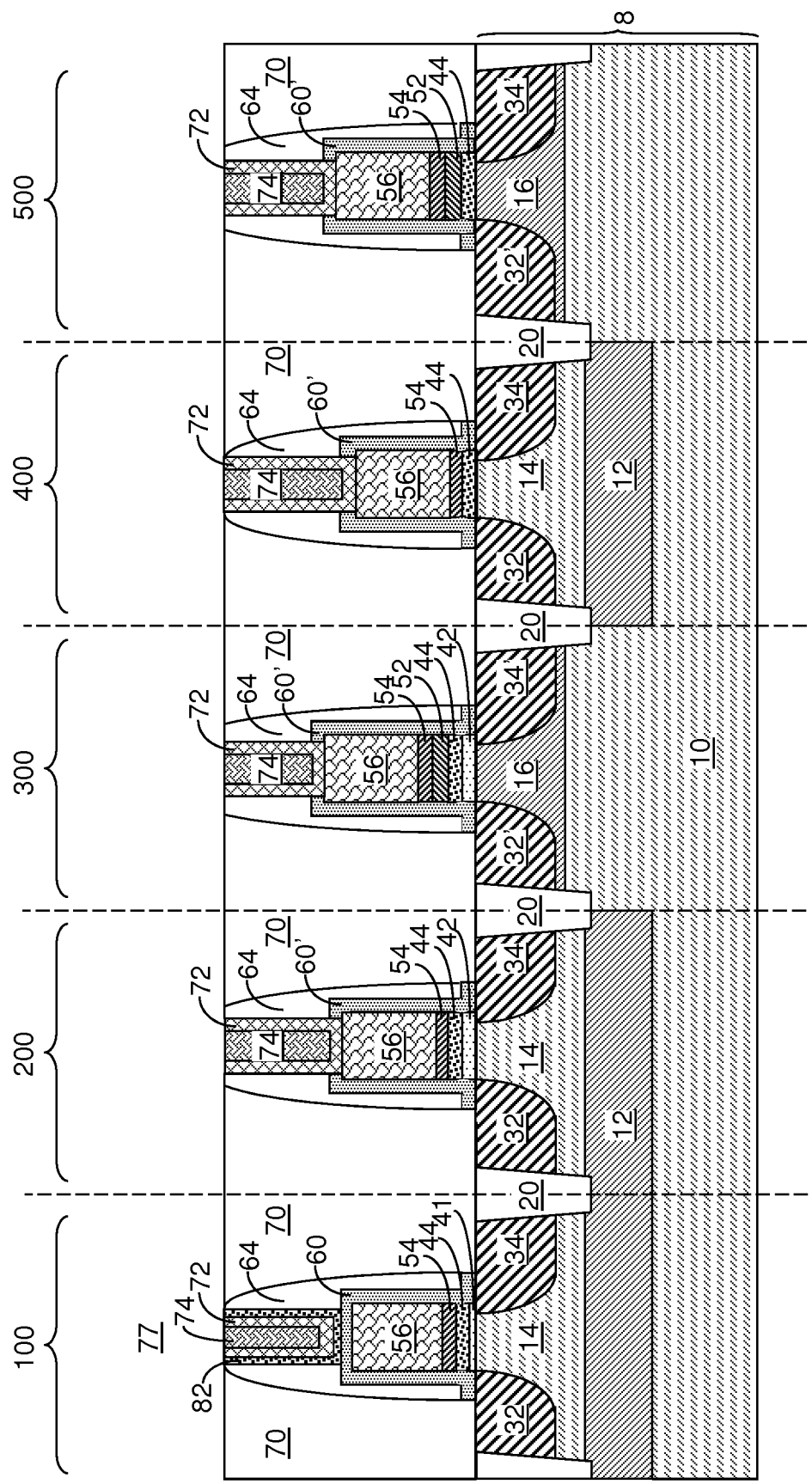
FIG. 17 is a vertical cross-sectional view of the fourth exemplary semiconductor structure after formation of replacement conductive material portions according to the fourth embodiment of the present disclosure.

Referring to FIG. 17, replacement conductive material portions are formed in the gate cavities 79 in the same manner as in the first embodiment. For example, at least one conductive material layer can be deposited and subsequently planarized. The at least one conductive material layer can include, for example, a metallic barrier layer and a conductive material layer. The excess portion of the metallic barrier layer and the conductive material layer deposited over the top surface of the planarization dielectric layer 70 as well as the portion of the second high-k gate dielectric layer 82L above the top surface of the planarization dielectric layer 70 are removed during planarization. The gate cavity 79 in the first device region 100 is filled with a control gate dielectric 82, a metallic material portion 72, and a second gate conductor material portion 74. Each gate cavity 79 in the second, third, fourth, and fifth device regions (200, 300, 400, 500) is filled with a stack of a metallic material portion 72 and a second gate conductor material portion 74. The control gate dielectric 82 is a remaining portion of the second high-k gate dielectric layer 82L. Each metallic material portion 72 is a remaining portion of the metallic barrier layer after the planarization, and each second gate conductor material portion 74 is a remaining portion of the conductive material layer.

The first device region 100 includes a non-volatile memory device that includes a field effect transistor having a tunnel dielectric and a control gate dielectric. The tunnel dielectric can include a stack of tack of the high-k gate dielectric portion 44 and the second oxide portion 41 in the first device region 100 or can consist of the high-k gate dielectric portion 44 in the first device region 100. The tunnel dielectric includes the first dielectric material having a dielectric constant greater than 8.0, i.e., the dielectric material of the high-k gate dielectric portion 44.

The field effect transistor in the first device region 100 includes a floating gate electrode structure, which is a stack of the second work function material portion 54 and the first gate conductor material portion 56 located in the first device region 100.

The control gate dielectric 82 contacts the floating gate electrode structure (54, 56) and includes a second dielectric material, i.e., the dielectric material of the second high-k gate dielectric layer 82L that has a dielectric constant greater than 8.0. The control gate dielectric 82 contacts first inner vertical sidewalls of the gate spacer 64, which is herein referred to as a second gate spacer, in the first device region 100. In the second, third, fourth, and fifth device region (200, 300, 400, 500), a metallic material portion 72, or a second gate conductor material portion 74 if metallic material portions are not employed, contacts first inner vertical sidewalls of a gate spacer 64. Each first gate spacer 60' contacts second vertical inner sidewalls of a second gate spacer 64. The second vertical inner sidewalls of each second gate spacer 64 are located below the level of the first vertical inner sidewalls of the second gate spacer 64, and are laterally offset from the first vertical inner sidewalls of the second gate spacer 64 in the outward direction.

Figure 18:
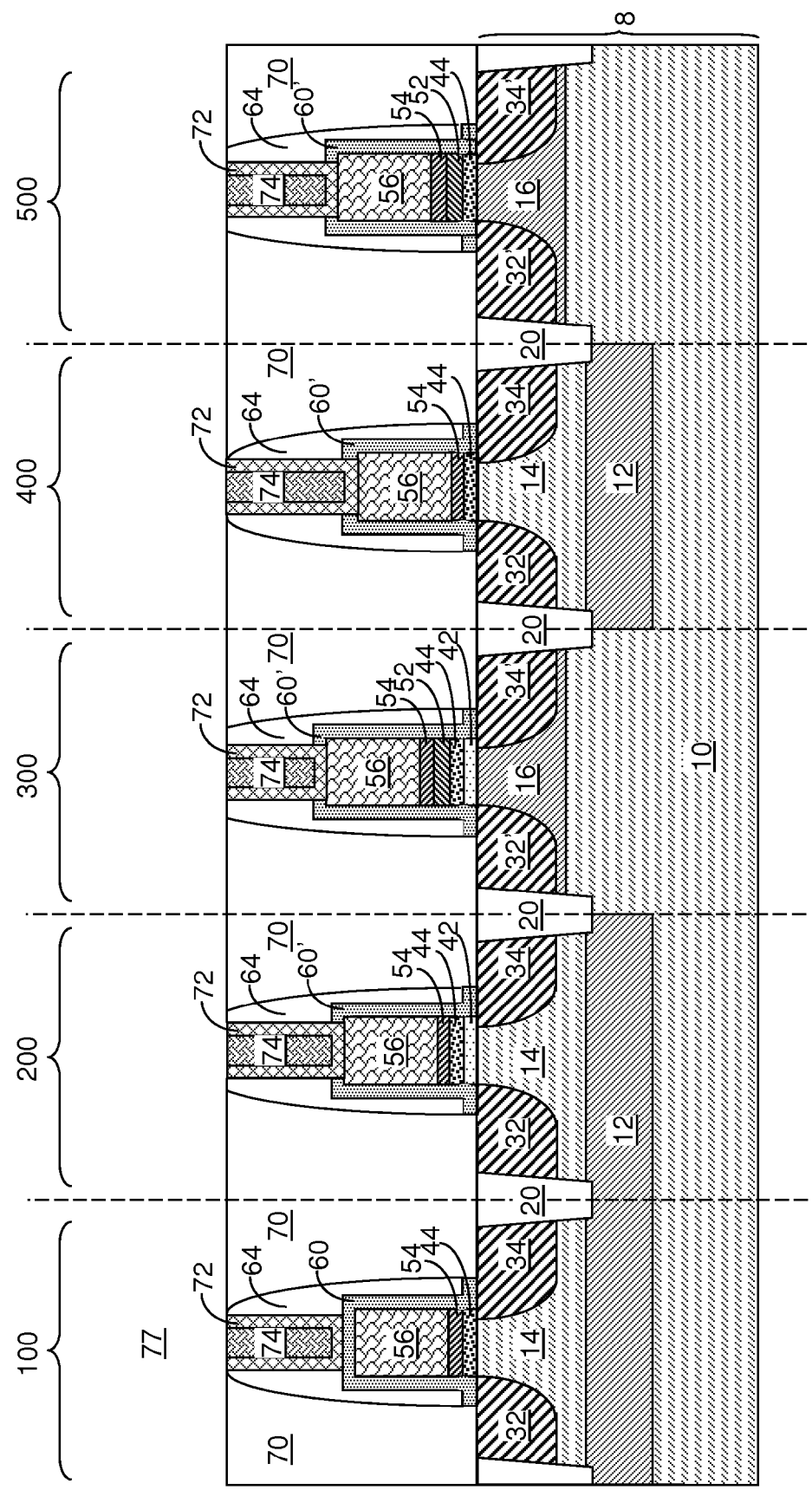
FIG. 18 is a vertical cross-sectional view of a fifth exemplary semiconductor structure according to a fifth embodiment of the present disclosure.

Referring to FIG. 18, a fifth exemplary semiconductor structure according to a fifth embodiment of the present disclosure can be derived from any of the first, second, third, and fourth exemplary semiconductor structures by omitting formation of the second oxide portion 41.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A semiconductor structure comprising a field effect transistor, said field effect transistor including:
   a tunnel dielectric comprising a first dielectric material having a dielectric constant greater than 8.0 and located on a semiconductor substrate;
   a floating gate electrode structure comprising at least a conductive material portion contacting said tunnel dielectric;
   a control gate dielectric located on said floating gate electrode structure and comprising a second dielectric material, wherein a vertical surface of said control gate dielectric is in physical contact with an edge of an interface between said conductive material portion and said tunnel dielectric;
   a control gate electrode structure located on said control gate dielectric, wherein a horizontal surface of said control gate dielectric is in contact with a top surface of said floating gate electrode, and a topmost surface of said control gate dielectric underlies, or is in physical contact with, a bottom surface of said control gate electrode; and another field effect transistor, said another field effect transistor including:
- a gate dielectric comprising at least a portion including said first dielectric material; and
- a gate electrode structure contacting said gate dielectric and comprising at least a first metallic material portion and a second metallic material portion, wherein said first metallic material portion has a same composition and thickness as said conductive material portion, and said second metallic material portion having a same material as a component of said control gate electrode structure.

2. The semiconductor structure of claim 1, wherein said control gate dielectric contiguously extends from a top surface of said floating gate electrode structure to said tunnel dielectric along sidewalls of said floating gate electrode structure.

3. The semiconductor structure of claim 2, further comprising a gate spacer contacting outer sidewalls of said control gate dielectric and sidewalls of said control gate electrode structure.

4. The semiconductor structure of claim 2, wherein said control gate dielectric comprises silicon oxide, silicon nitride, silicon oxynitride, or a combination thereof.

5. The semiconductor structure of claim 1, further comprising a first gate spacer contacting said control gate dielectric, sidewalls of said floating gate electrode structure, and sidewalls of said tunnel dielectric.

6. The semiconductor structure of claim 5, wherein said control gate dielectric comprises a dielectric material having a dielectric constant greater than 8.0.

7. The semiconductor structure of claim 1, further comprising a planarization dielectric layer, wherein a top surface of said control gate electrode structure is coplanar with a top surface of said planarization dielectric layer.

8. The semiconductor structure of claim 1, wherein said floating gate electrode structure further comprises a floating gate conductor material portion and said gate electrode structure further comprises a gate conductor material portion having a same composition and thickness as said floating gate conductor material portion.

9. The semiconductor structure of claim 1, wherein said component is another metallic material portion contacting said control gate dielectric, and said another metallic material portion and said second metallic material portion have top surfaces that are coplanar with a top surface of a planarization dielectric layer located on said semiconductor substrate.

10. The semiconductor structure of claim 1, wherein said gate dielectric comprising a stack of a lower gate dielectric portion having a dielectric constant less than 8.0 and said portion including said first dielectric material.

11. The semiconductor structure of claim 1, wherein said vertical surface of said control gate dielectric is in physical contact with a sidewall surface of said tunnel dielectric.

12. The semiconductor structure of claim 1, wherein a horizontal surface of said control gate dielectric is in physical contact with a top surface of a portion of said semiconductor substrate.

13. The semiconductor structure of claim 12, wherein said horizontal surface is a surface of a source region or a surface of a drain region.

14. The semiconductor structure of claim 1, wherein all sidewall surfaces of said floating gate electrode structure is in physical contact with sidewall surfaces of said control gate dielectric.

15. The semiconductor structure of claim 1, wherein all sidewall surfaces of said control gate dielectric is in physical contact with sidewall surfaces of said control gate dielectric.

16. The semiconductor structure of claim 1, wherein said conductive material portion is a metallic material portion.

17. A semiconductor structure comprising a field effect transistor, said field effect transistor including:
- a tunnel dielectric comprising a first dielectric material having a dielectric constant greater than 8.0 and located on a semiconductor substrate;
- a floating gate electrode structure comprising at least a conductive material portion contacting said tunnel dielectric;
- a control gate dielectric located on said floating gate electrode structure and comprising a second dielectric material;
- a control gate electrode structure located on said control gate dielectric;
- a first gate spacer contacting said control gate dielectric, sidewalls of said floating gate electrode structure, and sidewalls of said tunnel dielectric; and
- a second gate spacer contacting said first gate spacer and outer sidewalls of said control gate dielectric.

18. The semiconductor structure of claim 17, wherein said vertical surface of said control gate dielectric is in physical contact with a sidewall surface of said tunnel dielectric.

19. The semiconductor structure of claim 17, wherein a horizontal surface of said control gate dielectric is in physical contact with a top surface of a portion of said semiconductor substrate.

* * * * *